(12) United States Patent
Terada et al.

(10) Patent No.: US 6,249,848 B1
(45) Date of Patent: Jun. 19, 2001

(54) MEMORY WRITING DEVICE FOR AN ELECTRONIC DEVICE

(75) Inventors: Yukari Terada, Toyota; Yoshihiro Kawase, Anjo; Yoshiaki Kida, Iwakura; Takashi Ishida, Okazaki, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/625,402

(22) Filed: Jul. 25, 2000

Related U.S. Application Data

(62) Division of application No. 08/934,220, filed on Sep. 19, 1997.

(30) Foreign Application Priority Data

| Sep. 20, 1996 | (JP) | 8-250167 |
| Sep. 26, 1996 | (JP) | 8-254592 |
| Oct. 8, 1996 | (JP) | 8-267165 |

(51) Int. Cl.[7] ............................. G06F 12/12; G06F 15/18
(52) U.S. Cl. ......................... 711/154; 711/103; 710/60; 365/185.33; 709/233
(58) Field of Search ..................... 711/103, 165, 711/154, 166; 365/185.33, 218, 221, 239; 709/216, 233, 228; 710/29, 33, 58, 60, 11; 370/466, 468

(56) References Cited

U.S. PATENT DOCUMENTS

| 5,243,561 | 9/1993 | Yamauchi | 365/189.12 |
| 5,550,710 | 8/1996 | Rahamim et al. | 361/687 |
| 5,551,068 | 8/1996 | Goldsmith et al. | 370/466 |
| 5,699,546 | * 12/1997 | Nishikata et al. | 711/103 |

FOREIGN PATENT DOCUMENTS

| 2-99746 | 4/1990 | (JP) . |
| 7-311603 | 11/1995 | (JP) . |

* cited by examiner

*Primary Examiner*—Matthew Kim
*Assistant Examiner*—Denise Tran
(74) *Attorney, Agent, or Firm*—Nixon & Vanderhye P.C.

(57) ABSTRACT

To provide a memory-writing device which can simply and reliably write desired data to a nonvolatile memory of an electronic device, connection is made with an ECU to perform write processing to write write data from the memory-writing device to a flash ROM by copying a write-control program from the external portion to a RAM and executing the write-control program, and by sequentially sending the foregoing write-control program and write data to this ECU together with sending, at a predetermined timing, write-control information required for the ECU to execute the write-control program, the write-control program and the write-control information are stored in a freely attachable and removable first ROM and the write-control information stored in the first ROM is read and sent to the ECU at a memory-rewriting device to cause the write processing to be performed in the ECU. According to this device, an ECU of differing specifications can be supported merely by exchanging the first ROM.

5 Claims, 12 Drawing Sheets

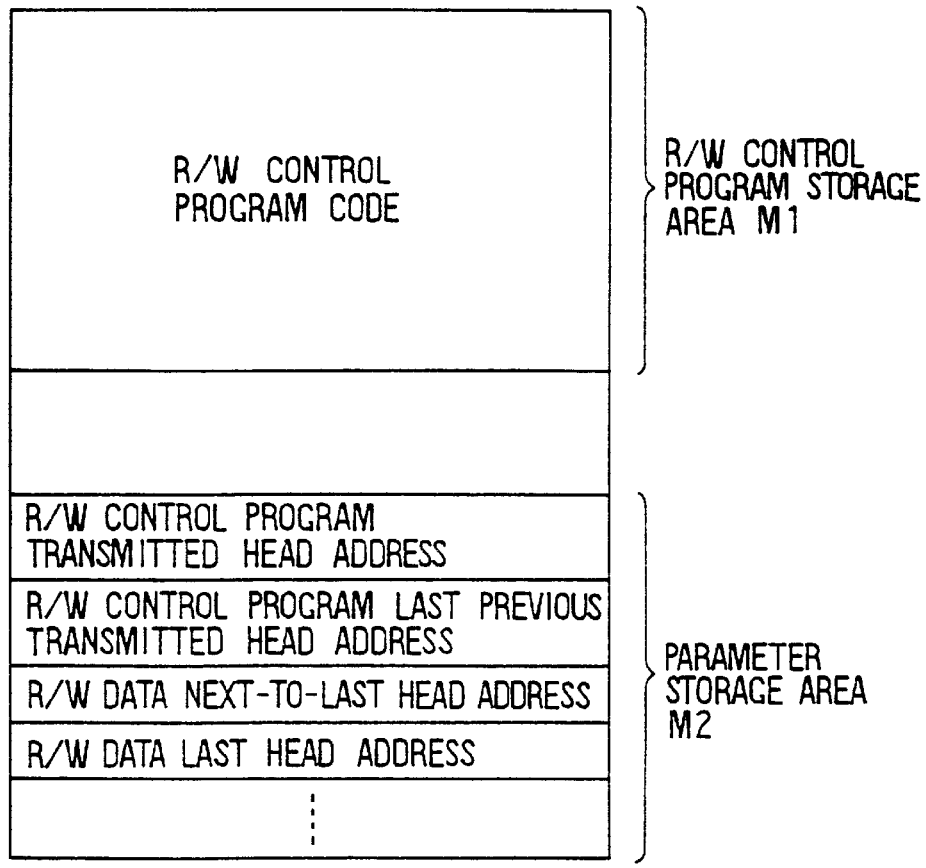
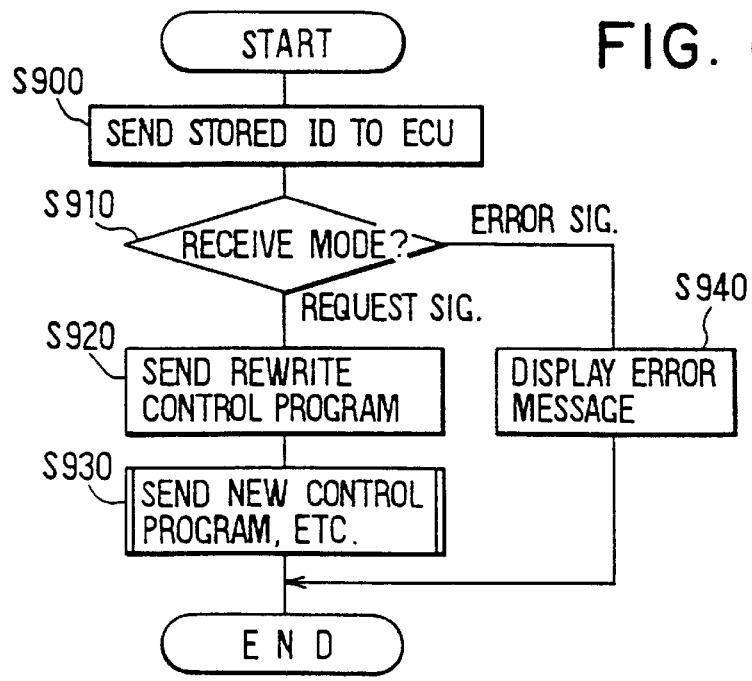

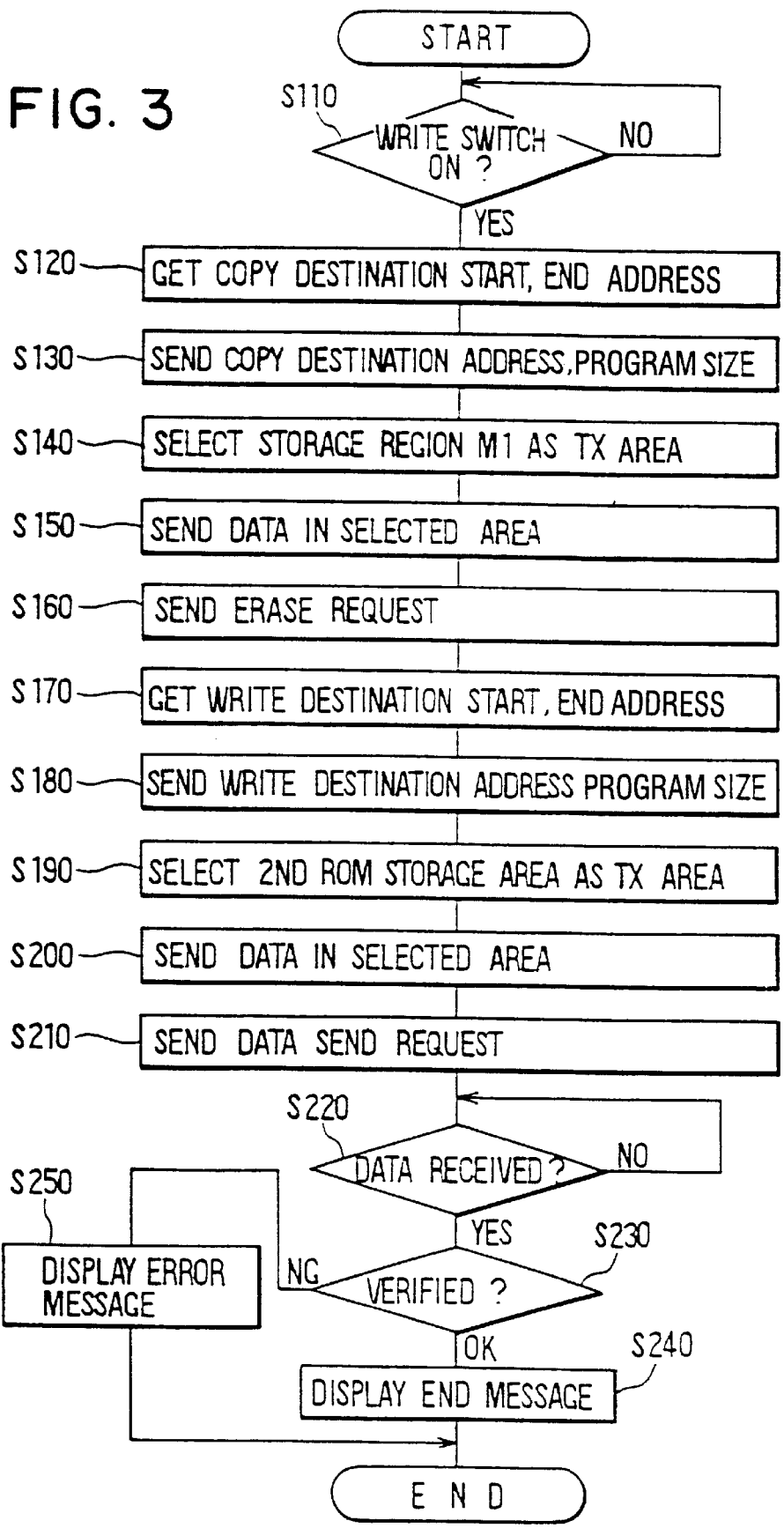

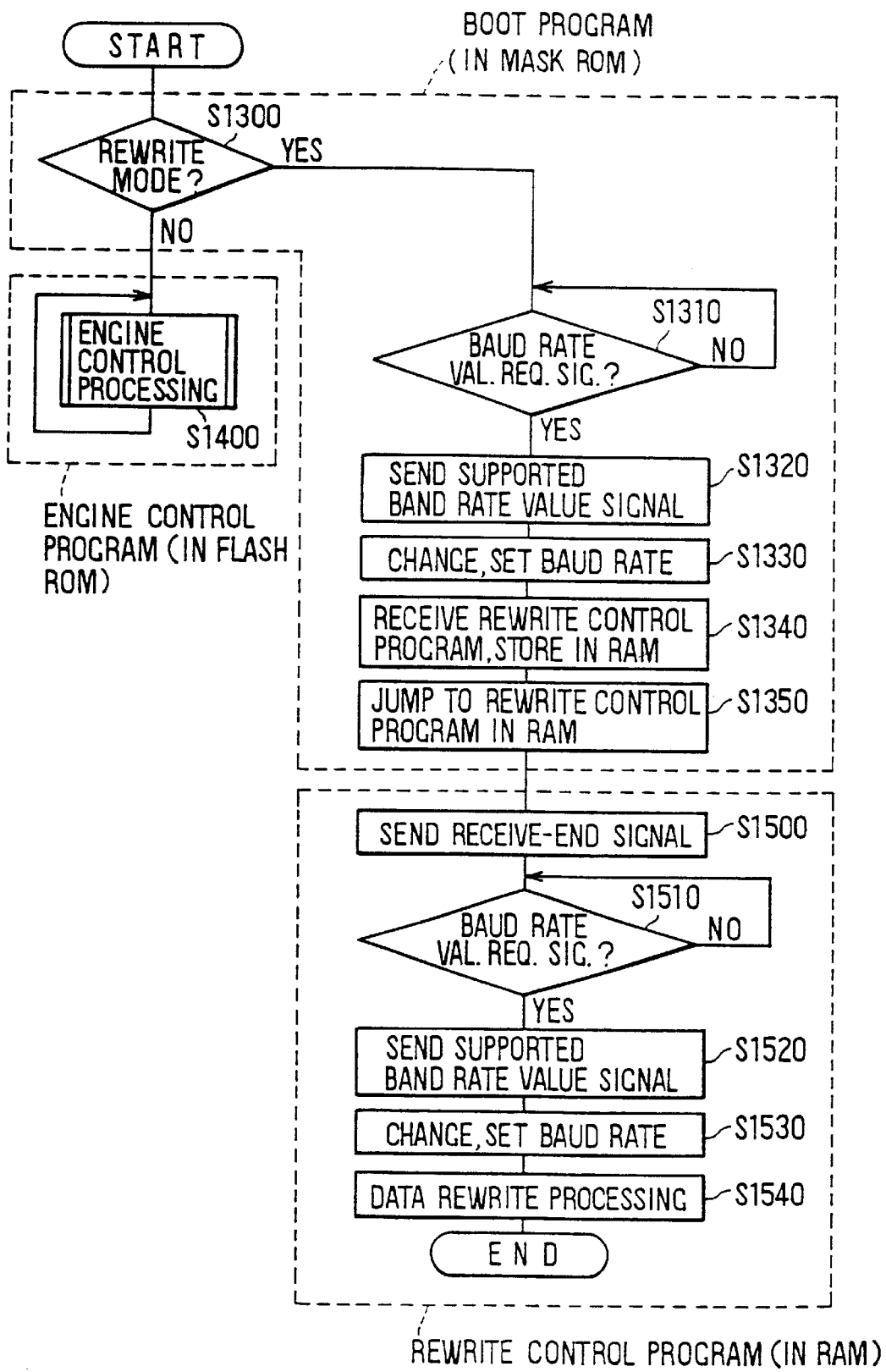

FIG. 14
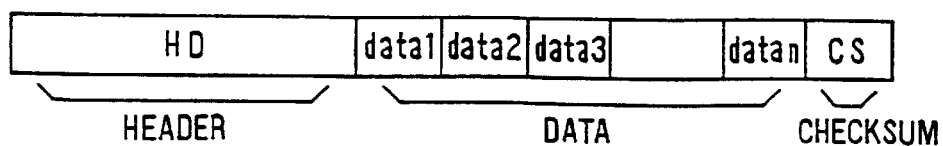
FIG. 15A MEMORY REWRITE DEVICE
FIG. 15B ECU SIDE DATA WRITING PERIOD
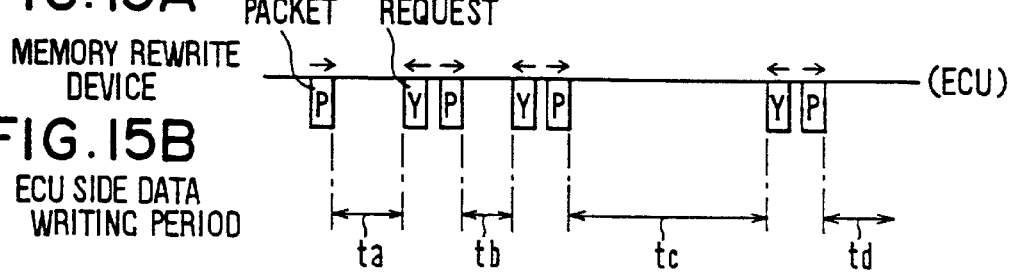
FIG. 16
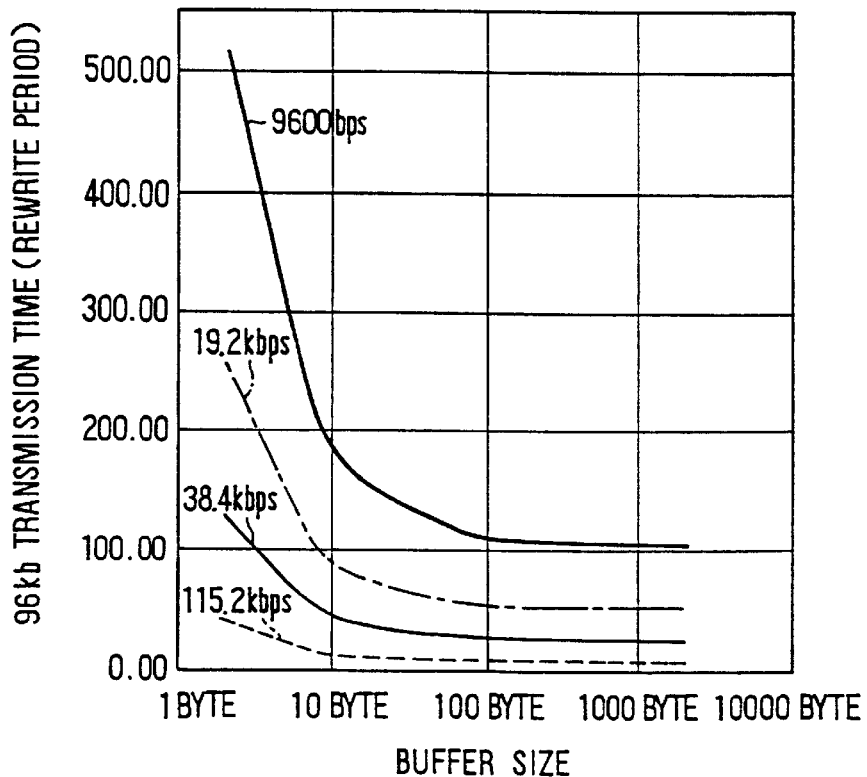

MEMORY WRITING DEVICE FOR AN ELECTRONIC DEVICE

This is a divisional of application Ser. No. 08/934,220, filed Sep. 19, 1997, now pending, the entire content of which is hereby incorporated by reference in this application

CROSS-REFERENCE TO RELATED APPLICATIONS

This application is related to Japanese Patent Application Nos. Hei 8-250167, 8-254592 and 8-267165, incorporated herein by reference.

BACKGROUND OF THE INVENTION

1. Field of the Invention

The present invention relates to systems for writing data to nonvolatile memory and rewriting data already stored in a nonvolatile memory wherein electrically writing or rewriting data is possible.

2. Description of Related Art

Conventionally, as has been disclosed, for example, in Japanese Patent Application Laid-Open No. Hei 2-99746, an electronic device provided with a nonvolatile memory such as an EEPROM or flash EEPROM (hereinafter termed "flash ROM") or the like to which data is electrically writable and capable of having a control program and control data stored therein has been proposed as a storage medium for storing a control program and control data for controlling a predetermined controlled object. According to such an electronic device, a control program and control data can be rewritten even after deployment in the market.

That is to say, the above-mentioned electronic device performs write processing so that when an external device separately provided is connected and a predetermined command is received from this external device, firstly, a write-control program sent from the external device is received and stored in a predetermined storage region of RAM, and subsequently by executing this write-control program in RAM, write data sent thereafter from the external device (i.e., the control program and control data for controlling the predetermined controlled object) is received, and this write data is written to nonvolatile memory.

The storage region of RAM to which the write-control program is to be stored, the storage region of nonvolatile memory to which the write data is to be written, the communication protocol of the communication conducted with the memory-writing device, and so on may vary from one electronic device to another.

In this regard, to enable data writing to nonvolatile memory to be performed even for electronic devices of such differing specifications, conventionally write-control information such as address information indicating a storage destination of the write-control program, address information indicating a write destination of the write data, and moreover the communication protocol, was sent from the memory-writing device to the electronic device, and a write-control program based on this write-control information was executed on the electronic-device side.

Accordingly, with a memory-writing device according to the related art, a personal computer or the like is connected and write-control information sent to the electronic device is modified each time that an electronic device of differing specifications is connected.

However, with the above-described memory-writing device according to the related art, each time that an electronic device of differing specifications is connected, a personal computer must be connected, and work is troublesome. Additionally, because the write-control information must be manually modified by operating a keyboard of the personal computer, it is possible to enter an erroneous value, and the desired data might not reliably be written to the nonvolatile memory of the electronic device.

SUMMARY OF THE INVENTION

In light of the above problems of the prior art, it is an object of this invention to provide a memory-writing device for an electronic device which can simply and reliably write desired data to a nonvolatile memory thereof.

It is a further object of this invention to provide an electronic control unit which can reliably prevent a control program and control data already stored in nonvolatile memory from being rewritten by an incompatible control program or control data, and a memory-rewriting system of a favorable memory-rewriting device and the electronic control unit for rewriting this control program and control data stored in nonvolatile memory of this electronic control unit.

It is a still further object of this invention to provide an electronic device which can rapidly rewrite data within its nonvolatile memory.

The above objects are achieved according to a first aspect of the present invention by providing a memory-writing device which can simply and reliably write desired data to a nonvolatile memory of an electronic device. Connection is made with an ECU to perform write processing to write write data from the memory-writing device to a flash ROM by copying a write-control program from the external portion to a RAM and executing the write-control program, and by sequentially sending the foregoing write-control program and write data to this ECU together with sending, at a predetermined timing, write-control information required for the ECU to execute the write-control program. The write-control program and the write-control information are stored in a freely attachable and removable first ROM. The write-control information stored in the first ROM is read and sent to the ECU at a memory-rewriting device to cause the write processing to be performed in the ECU. According to this device, an ECU of differing specifications can be supported merely by exchanging the first ROM.

Other objects and features of the present invention will appear in the course of the description thereof, which follows.

BRIEF DESCRIPTION OF THE DRAWINGS

Additional objects and advantages of the present invention will be more readily apparent from the following detailed description of preferred embodiments thereof when taken together with the accompanying drawings in which:

FIG. 2 is an explanatory diagram for describing the stored contents of a first ROM in the memory-writing device of FIG. 1;

FIG. 3 is a flowchart of processing executed on a memory-writing device side in the first embodiment;

FIG. 6 is a flowchart of processing executed on a memory-rewriting device side in the second embodiment;

FIG. 12 is a flowchart of processing executed on an engine-control unit (ECU) side in the fourth embodiment;

FIG. 14 is an explanatory diagram for describing a format of data sent from the memory-rewriting device in the fourth embodiment;

FIGS. 15A and 15B is an explanatory diagram for describing a mode of operation of the fourth embodiment; and FIG. 16 is an explanatory diagram for describing a sending time (rewrite time) of data according to the memory-rewriting system of the fourth embodiment.

DETAILED DESCRIPTION OF THE PRESENTLY PREFERRED EXEMPLARY EMBODIMENTS

Preferred embodiments of the present invention will be described hereinafter with reference to the drawings.

(First Embodiment)

Figure 1:
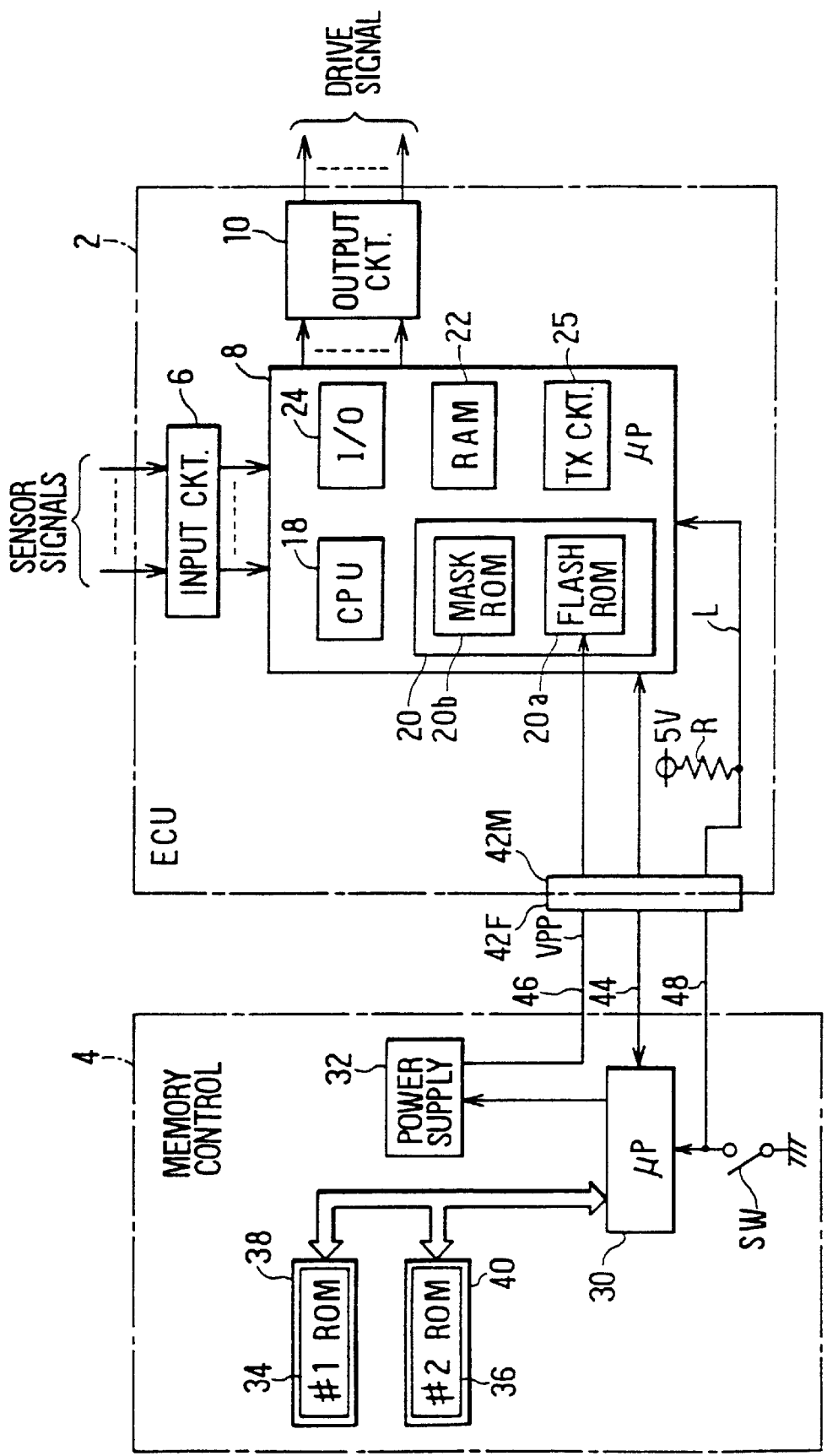
FIG. 1 is a block diagram of the overall structure of a memory-writing system of an electrical device according to a first preferred embodiment of the present invention.

FIG. 1 is a block diagram of the overall structure of a memory-writing system for an electronic device according to a first preferred embodiment of the present invention which is made up of an engine control unit (hereinafter termed "ECU") 2 for controlling an internal combustion engine mounted on a vehicle, and a memory-writing device 4 connected to the ECU 2 when rewriting, or when newly writing, a program or data for engine-control use incorporated within the ECU 2.

As shown in FIG. 1, the ECU 2 has an input circuit 6 for inputting and performing waveform processing for signals from various sensors to detect the running state of the engine, a single-chip microprocessor (hereinafter termed a microprocessor) 8 for executing various types of processing for controlling the engine based on sensor signals from the input circuit 6, and an output circuit 10 for outputting drive signals to actuators such as an injector (fuel-injection valve), igniter, and so on mounted on the engine based on control signals from the microprocessor 8.

Accordingly, the microprocessor 8 has a CPU 18 as is known in the art for operating in accordance with a program, a nonvolatile ROM 20 for storing a program and data necessary to cause the CPU 18 to be operated, a RAM 22 for temporarily storing computational results and the like of the CPU 18, an I/O unit 24 for receiving signals from the input circuit 6 and the like, along with operating control signals to the output circuit 10, and a communication circuit for performing data communication with the memory-writing device 4.

Herein, a flash ROM 20a in which data is electrically erasable and writable and a mask ROM wherein rewriting of data is impossible are provided as the ROM 20.

In the manufacturing process of the ECU 2, after the microprocessor 8 has been mounted on the ECU 8, the control program and control data for engine-control use are newly written to the flash ROM 20a, and a boot program executed immediately after a reset is previously stored in the mask ROM 20b prior to mounting the microprocessor 8 on the ECU 2. A nonvolatile memory in which data is electrically erasable and writable, similarly to the flash ROM 20a, may be employed instead of the mask ROM 20b if rewriting of data is prohibited.

In such an ECU 2, the microprocessor 8 (CPU 18) starts the boot program within the mask ROM 20b immediately after a reset operation, and at an ordinary time when the memory-writing device 4 is not connected, the engine-control program (i.e., the control program for engine-control use) within the flash ROM 20a is called by this boot program, and control of the engine is performed.

Furthermore, when the microprocessor 8 determines that a write mode such as will be described later is in effect when the boot program has been started, the write-control program sent from the memory-writing device 4 is received and stored in the RAM 22, the data in the flash ROM 20a is erased by executing this write-control program in RAM 22, and thereafter write processing is performed to write the write data (i.e., the new control program and control data for engine-control use) sent from the memory-writing device 4 to the flash ROM 20a.

Accordingly, in a case where the control program and control data for engine-control use have already been written to the flash ROM 20a, this engine-control program and data are rewritten, and during fabrication of the ECU 2 when the control program and control data for engine-control use have not yet been written to the flash ROM 20a, the control program and control data for engine-control use are newly written to the flash ROM 20a.

A case of rewriting the control program and control data for engine-control use within the flash ROM 20a will be described hereinafter, but a case of newly writing the control program and control data for engine-control use to the flash ROM 20a in the manufacturing process of the ECU 2 is exactly the same.

Meanwhile, the memory-writing device 4 has a microprocessor 30 including a CPU, ROM, RAM, and the like to execute processing for rewriting the flash ROM 20a in the microprocessor 8 on the ECU 2 side; a power-source circuit 32 for supplying a required write voltage (in this embodiment, 12 V) Vpp to the microprocessor 8 on the ECU 2 side during the data writing of the flash ROM 20a in accordance with an instruction from this microprocessor 30; and a write switch SW for changing an operating mode of the ECU 2 from an ordinary mode to perform control of the engine to a write mode to write data to the flash ROM 20a.

Furthermore, the memory-writing device 4 has a first ROM 34 as a first storage medium which stores the write-control program (more specifically, program code making up the write-control program) sent to the ECU 2 and control parameters as write-control information required for the microprocessor 8 on the ECU 2 side to execute the write-control program. The memory-writing device also includes a second ROM 36 as a second storage medium which stores the write data to be sent to the ECU 2 (i.e., the control program and control data for engine-control use to be written to the flash ROM 20a). Accordingly, the first ROM 34 and the second ROM 36 are detachably disposed on the memory-writing device 4 by respective IC sockets 38 and 40 as is known in the art.

Here, a storage region of the first ROM 34 is divided into a write-control program storage region M1 and a parameter storage region M2. The program code (write-control program code) making up the write-control program is stored in the write-control program storage region M1, and control parameters are stored in the parameter storage region M2 as the above-described write-control information.

As shown in FIG. 2, storage region M2 includes a starting address of the copy destination of the write-control program in the microprocessor 8 on the ECU 2 side (that is, an address where storage of the write-control program in the RAM 22 on the ECU 2 side is to start), and similarly, an end address of the copy destination of the write-control program, a starting address of the write destination of the write data in the microprocessor 8 on the ECU 2 side (that is, an address where writing of the write data to the flash ROM 20a on the ECU 2 side is to start), and similarly, an end address of the write destination of the write data. Additionally, although not illustrated, information and the like relating to the communication protocol (communication speed, communication format, and so on) of data communication between the memory-writing device 4 and the ECU 2 also is stored in the parameter storage region M2 as other control parameters.

Such a connection of the memory-writing device 4 and the ECU 2 is performed by mating a female connector 42F disposed on the memory-writing device 4 side with a male connector 42M disposed on the ECU 2, as shown in FIG. 1.

That is, when the foregoing two connectors 42F and 42M are mated, serial data communication between the microprocessor 30 on the memory-writing device 4 side and the microprocessor 8 on the ECU 2 side becomes possible via a communication line 44, and write voltage Vpp required during the data write of the flash ROM 20a from the power-supply circuit 32 of the memory-writing device 4 side to the microprocessor 8 of the ECU 2 side is supplied via a power-source supply line 46. Furthermore, a signal line 48 connected to ground voltage (0 V) via the write switch SW on the memory-writing device 4 side is connected to a signal line for mode-determining use L pulled up to 5 V by a resistor R on the ECU 2 side, and owing thereto, the signal line for mode-determining use L changes from a high level (5 V) to low level (0 V) on the ECU 2 side when the write switch SW on the memory-writing device 4 side goes on. Accordingly, the microprocessor 8 of the ECU 2 determines the mode to be the write mode when the signal line for mode-determining use L is at low level while starting the above-described boot program.

Processing executed by the microprocessor 30 of the memory-writing device 4 and processing executed by the microprocessor 8 of the ECU 2 will be described next with reference to FIGS. 3 and 4.

FIG. 3 is a flowchart of processing executed by the microprocessor 30 of the memory-writing device 4. FIG. 4 is a flowchart indicating processing executed by the microprocessor 8 of the ECU 2, and processing of steps (hereinafter termed simply "S") 300 through S340 thereof is executed by the boot program in the mask ROM 20b, whereas processing of S400 is executed by the engine-control program in the flash ROM 20a. Accordingly, processing of S500 through S550 is executed by the write-control program sent from the memory-writing device 4 and copied to the RAM 22.

First, in the memory-writing device 4, when the operator performs a predetermined operation after connection to the ECU 2, the microprocessor 30 executes the processing shown in FIG. 3.

Namely, in the initial step S110, it is determined whether the write switch SW is on, and when the write switch SW is determined to be on, execution advances to the subsequent S120, the starting address and the end address of the copy destination of the write-control program in the microprocessor 8 on the ECU 2 side is read from the first ROM 34 (the parameter storage region M2 in FIG. 2) mounted in the IC socket 38, this starting address that has been read is acquired as the copy-destination address for the write-control program, and the difference between the foregoing end address and starting address is acquired as the size of the write-control program (i.e., the volume of the write-control program).

Accordingly, in the subsequent S130, the copy-destination address and size of the write-control program acquired in S120 are sent to the ECU 2. In the subsequent S140, the write-control program storage region M1 in the first ROM 34 is selected as the transmission area for sending the write-control program to the ECU 2, and in the subsequent S150, the data (i.e., the program code of the write-control program) stored in this selected transmission area is sent to the ECU 2. Accordingly, the write-control program stored in the first ROM 34 is sent to the microprocessor 8 on the ECU 2 side by the processing of S140 and S150.

When such sending of the write-control program has been completed, execution advances to S160 and an erase request for instructing data erase of the flash ROM 20a is sent to the microprocessor 8 on the ECU 2 side.

Next, in S170, the starting address and the end address of the write destination of the write data in the microprocessor 8 on the ECU 2 side are read from the first ROM 34 (the parameter storage area M2 in FIG. 2), this starting address that has been read is acquired as the write-destination address for the write data, and the difference between the foregoing end address and starting address is acquired as the size of the write data (i.e., the volume of the write data).

In the subsequent S180, the write-destination address and the size of the write data acquired in S170 are sent to the ECU 2. In the subsequent S190, the storage region in the second ROM 36 mounted in the IC socket 40 wherein the write data is stored is selected as the transmission area for sending the write data to the ECU 2, and in the subsequent S200, the data (i.e., the write data as the control program and control data for engine-control use to be written to the flash ROM 20a) stored in this selected transmission area is sent to the ECU 2.

Accordingly, the write data stored in the second ROM 36 is sent to the microprocessor 8 on the ECU 2 side by the processing of S190 and S200, and on the ECU 2 side, the write data from the memory-writing device 4 is written in the flash ROM 20a, as will be described later.

When the sending of the write data in S200 has been completed, execution advances to S210 and a data send request for reading the data written to the flash ROM 20a and sending the same is sent to the microprocessor 8 on the ECU 2 side.

Next, in S220, the sending of data from the ECU 2 side is awaited, and when the data is received, execution advances to S230 and the write data stored in the second ROM 36 and the data received from the ECU 2 (i.e., the write data written to the flash ROM 20a on the ECU 2 side) are compared (verified), and when the two sets of data coincide, execution advances to the subsequent S240. Accordingly, in this S240, an "end" message indicating that writing of the data has been completed is shown on a predetermined display device (not illustrated), and thereafter the processing on the memory-writing device side is completed.

In contrast thereto, when it has been determined in S230 that the write data stored in the second ROM 36 and the data received from the ECU 2 do not coincide, execution is transferred to S250, an "error" message indicating that the data could not be written is shown on the above-mentioned display device, and thereafter the processing on the memory-writing device side is completed.

Figure 4:
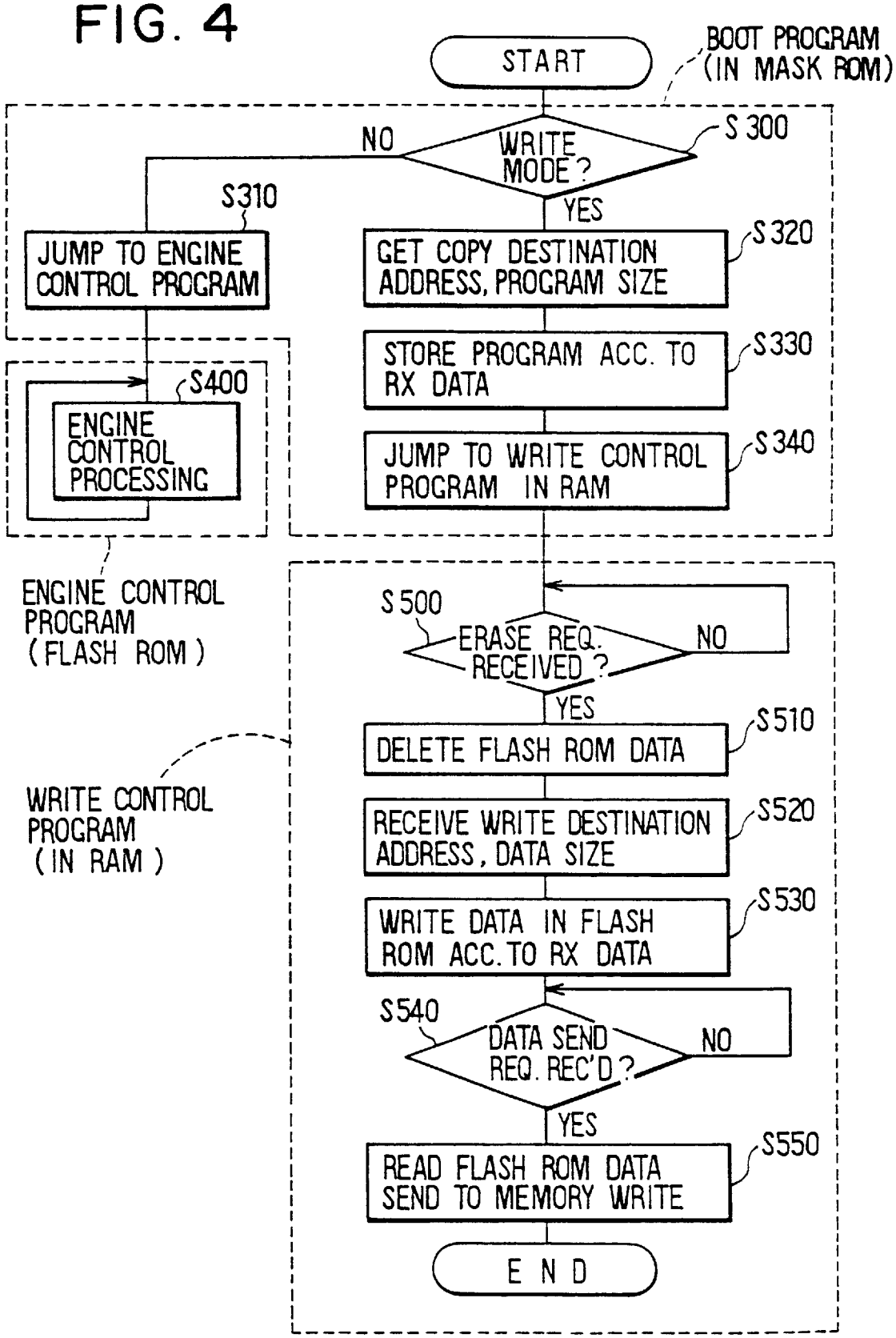
FIG. 4 is a flowchart indicating processing executed on an engine-control unit (ECU) side in the first embodiment.

Next, when the power source is actuated at the ECU 2, the microprocessor 8 commences operation from a reset state, and the processing shown in FIG. 4 is executed.

Initially, the boot program stored in the mask ROM 20b is started, and first in S300, it is determined whether the write mode is in effect by determining whether the signal line for mode-determining use L is at a low level. Accordingly, when the signal line for mode-determining use L is not low, the mode is determined to be not the write mode but rather the ordinary mode, and execution advances to S310 and jumps to the engine-control program.

When this occurs, the control program stored in the flash ROM 20a is started, and thereafter, as shown in S400 in FIG. 4, engine-control processing referencing the control data for engine-control use is executed. The engine-control processing of S400 is executed in a sequence wherein optimal fuel-injection amount, ignition timing, and so on for the engine are calculated on a basis of the various sensor signals from the input circuit 6 and the control data stored in the flash ROM 20a, and control signals for driving the actuators for the injector, the igniter, and so on are output to the output circuit 10 in accordance with this calculation result.

Meanwhile, in a case where S300 determines the write mode in the boot program, i.e., in a case where the signal line for mode-determining use L was low due to the memory-writing device 4 being connected to the ECU 2 and the write switch SW being switched on, execution is transferred to S320.

Accordingly, in this S320, the copy-destination address and size of the write-control program sent from the memory-writing device 4 in S130 and S150 in the above-described FIG. 3 and the write-control program are received, and in the subsequent S330, the write-control program received in S320 is stored in the region of the RAM 22 specified by the copy-destination address and size received in S320.

In the subsequent S340, execution jumps to the write-control program stored in the RAM 22 in S330.

When this occurs, the write-control program sent from the memory-writing device 4 is executed in the RAM 22, and because of this, the processing of S500 through S550 is performed.

That is, first, in S500, the receipt of the erase request sent from the memory-writing device 4 in S160 in the above-described FIG. 3 is awaited. When the erase request is determined to have been received, execution advances to S510, and the data within the flash ROM 20a is deleted.

Accordingly, in the subsequent S520, the write-destination address and size of the write data sent from the memory-writing device 4 in S180 and S200 in the above-described FIG. 3 and the write data are received, and in the subsequent S530, the write data received in S520 is written to the region of the flash ROM 20a specified by the write-destination address and size received in S320.

When the writing of the data to the flash ROM 20a in the S530 has been completed, then in the subsequent S540, the receipt of a data send request sent from the memory-writing device 4 in S210 of the above-described FIG. 3 is awaited, and when the data send request is determined to have been received, execution advances to S550, the data written to the flash ROM 20a in S530 is read and sent to the memory-writing device 4, and thereafter all processing is ended.

The data sent to the memory-writing device 4 in S550 is compared with the write data stored in the second ROM 36 on the memory-writing device 4 side, as was described above, and when the two sets of data coincide, it is determined that the writing of the data at the ECU 2 has ended uneventfully.

Meanwhile, although not indicated in the flowcharts of FIG. 3 and FIG. 4, when the microprocessor 30 on the memory-writing device 4 side determines that the write switch SW was switched on in S110 in FIG. 3, information relating to the communication protocol of the data communication performed with the ECU 2 is read from the parameter storage region M2 of the first ROM 34 and this information is sent to the ECU 2 using a previously established prescribed communication speed, communication format, and so on prior to executing the processing of S120, so that data communication is performed in accordance with the above-described information relating to protocol which was read when performing communication with the ECU 2 in the processing of S120 or after.

Accordingly, when the microprocessor 8 on the ECU 2 side as well determines that the write mode is in effect in S300 of FIG. 4, information relating to the above-described communication protocol sent from the memory-writing device 4 is received with the previously established prescribed communication speed, communication format, and so on, so that data communication is performed in accordance with the above-described information relating to protocol which was read when performing communication with the memory-writing device 4 in the processing of S320 or after.

In this way, according to this embodiment, the microprocessor 8 of the ECU 2 stores the write-control program sent from the memory-writing device 4 in a region of the RAM 22 according to the copy-destination address and size of the write-control program sent from the memory-writing device 4 prior thereto, and executes this write-control program, and because of this, write data sent thereafter from the memory-writing device 4 is written to a region of the flash ROM 20a similarly according to the write-destination address and size of the write data sent from the memory-writing device 4. Additionally, the microprocessor 8 on the ECU 2 side performs data communication with the memory-writing device 4 in accordance with the communication speed and communication format corresponding to the information relating to the communication protocol initially sent from the memory-writing device 4.

In particular, with the memory-writing device 4, control parameters required for the microprocessor 8 on the ECU 2 side to execute the write-control program, such as the starting address and the end address of the copy destination of the write-control program (i.e., information indicating the copy-destination address and size of the write-control program on the ECU 2 side), the starting address and the end address of the copy destination of the write data (that is, information indicating the write-destination address and size of the write data on the ECU 2 side), information relating to the communication protocol of the data communication performed with the ECU 2, and so on are stored together with the write-control program in the first ROM 34, as shown in FIG. 2. Accordingly, the microprocessor 30 on the memory-writing device 4 side reads the foregoing control parameters from this first ROM 34 and sends the foregoing control parameters to the ECU 2.

Consequently, according to such a memory-writing device 4 of this embodiment, in a case where a data write operation is performed for the ECU 2 of differing specifications in the address of the RAM 22 wherein the write-control program is to be stored, the address of the flash ROM 20a to which the write data is written, the communication protocol of the data communication performed with the memory-writing device 4, or the like, the write data stored in the second ROM 36 can reliably be written to the flash ROM 20a on the ECU 2 side when the first ROM 34 wherein the control parameters conforming to the these ECU 2 specifications are stored is mounted in the IC socket 38 and the write switch SW is switched on.

According to the memory-writing device 4 of this embodiment, operation to connect a personal computer to the memory-writing device 4 and modify control parameters by keyboard operation as with a device according to the above-described related art is completely unnecessary, and so the desired data can be simply and reliably written to the flash ROM 20a of the ECU 2.

Further, with the memory-writing device 4 of the above-described embodiment, the control parameters are stored as the write-control information in the first ROM 34 wherein the write-control program is stored, but the control parameters may be stored in a free region of the second ROM 36 wherein the write data is stored, instead of the first ROM 34, so that the microprocessor 30 reads the control parameters from the second ROM 36 and sends the control parameters to the ECU 2.

However, when the control parameters are stored in the first ROM 34 wherein the write-control program is stored, as in the above-described embodiment, in a case of writing differing write data to a plurality of ECUs 2 of identical specifications it is sufficient to store solely data to be written to the flash ROM 20a of the ECU 2 in the second ROM 36, with no need existing to additionally store the control parameters, and so there exists an advantage with respect to this point.

Meanwhile, with the memory-writing device 4 of the above-described embodiment, the ROMs 34 and 36 were employed as the freely detachable first and second storage media, but a freely detachable external memory such as a floppy disc, a magnetic tape, or the like may be employed instead of the ROMs 34 and 36. An IC card is also acceptable.

The ECU 2 of the above-described embodiment was provided with the flash ROM 20a as a nonvolatile memory to which data is electrically writable, but an EEPROM may be employed, or a PROM (for example a one-time PROM) having one or more write regions may be employed.

Moreover, effects similar to the above-described embodiment can be obtained even in a case wherein the control parameters (i.e., the write-control information) stored in the first ROM 34 (i.e., the first storage medium) are not restricted to those described above, and other information may be stored therein.

(Second Embodiment)

The overall structure of a second preferred embodiment according to the present invention is substantially identical to the overall structure of the first embodiment indicated in FIG. 1. However, a boot program executed immediately after a reset and an identification code (hereinafter terms an "ID") of the ECU 2 where the microprocessor 8 is mounted are previously stored in the mask ROM 20b before the microprocessor 8 is mounted on the ECU 2.

The foregoing ID is established for each type and specification of engine which the ECU 2 controls, model name and grade name of vehicle whereon ECU 2 is mounted, and the like.

Furthermore, a new control program and control data prepared for writing to the flash ROM 20a of the ECU 2 and the ID of the ECU conforming to this control program and control data for engine-control use, i.e., the ID of the ECU which is the data rewrite target, are stored in the second ROM 36 of the memory-rewriting device 4.

Processing executed by the microprocessor 8 of the ECU 2 and processing executed by the microprocessor 30 of the memory-rewriting device 4 will be described next with reference to FIGS. 5 and 6.

Figure 5:
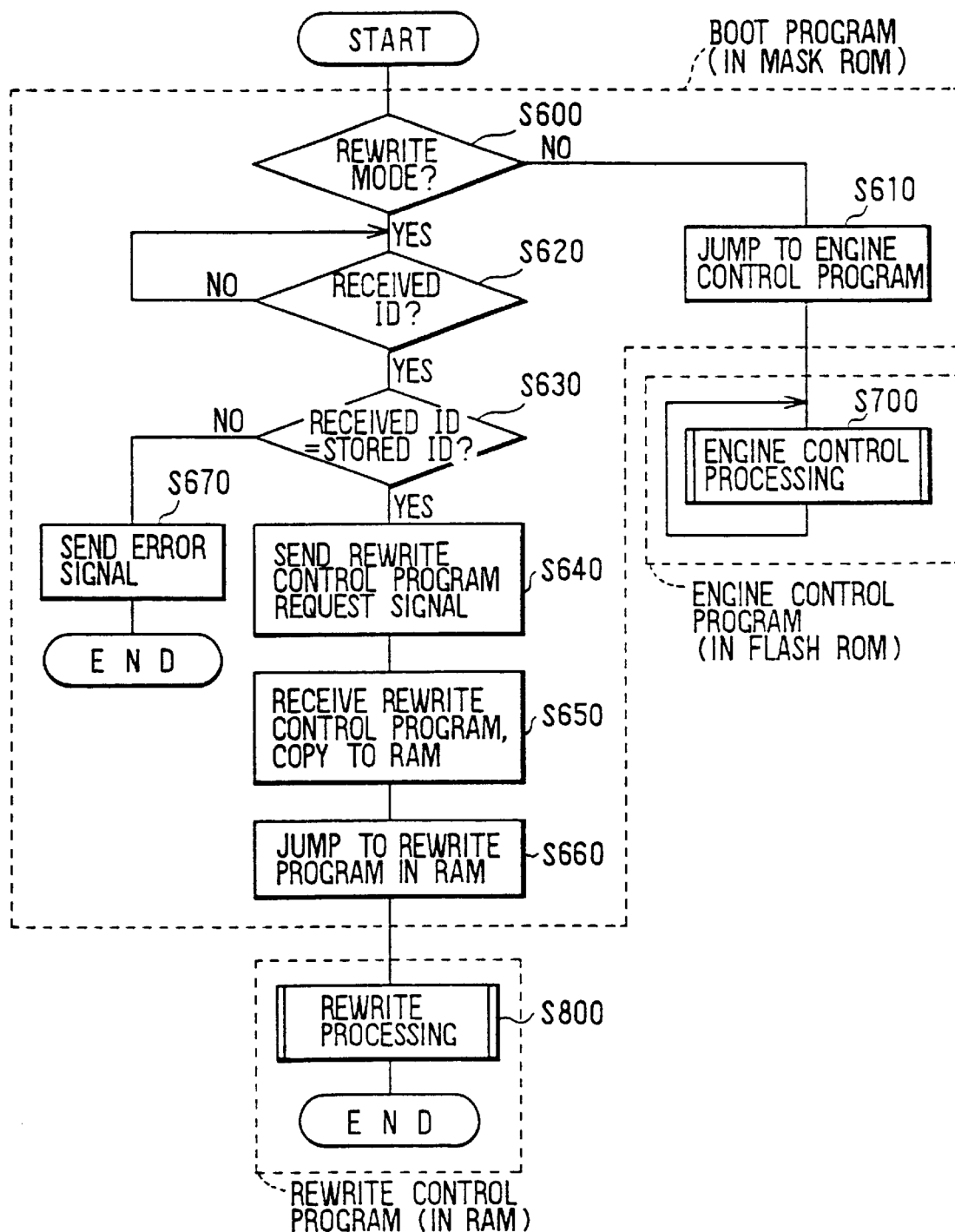
FIG. 5 is a flowchart indicating processing executed on an engine-control unit (ECU) side in a second preferred embodiment of the present invention.

FIG. 5 is a flowchart of processing executed by the microprocessor 8 of the ECU 2, and processing of S600 through S670 thereof is executed by the boot program in the mask ROM 20b, whereas processing of S700 is executed by the engine-control program in the flash ROM 20a. Accordingly, processing of S800 is executed by a rewrite-control program sent from the memory-rewriting device 4 and copied to the RAM 22. FIG. 6 is a flowchart indicating processing executed by the microprocessor 30 of the memory-rewriting device 4.

Firstly, with the ECU 2, when the power source is actuated such as by switching on the ignition switch of the vehicle and the microprocessor 8 begins to operate from a reset state, the boot program stored in the mask ROM 20b is started.

Accordingly, as shown in FIG. 5, it is determined whether the rewrite mode is in effect by determining whether the signal line for mode-determining use L is at low level. When the signal line for mode-determining use L is not low, the mode is determined to be not the rewrite mode but rather the ordinary mode, and execution advances to S610 and jumps to the engine-control program.

When this occurs, the control program stored in the flash ROM 20a is started, and thereafter, as shown in S700, engine-control processing referencing the control data for engine-control use is executed.

The engine-control processing of S700 is repeatedly executed in a sequence where optimal fuel-injection amount, ignition timing, and so on for the engine are calculated on a basis of the various sensor signals from the input circuit 6 and the control data stored in the flash ROM 20a, and control signals for driving the actuators for the injector, the igniter, and so on are output to the output circuit 10 in accordance with this calculation result. Accordingly, running of the engine becomes possible due to such engine-control processing being executed.

Meanwhile, where the foregoing step S600 determines the system to be in the rewrite mode in the boot program, i.e., in a case where the signal line for mode-determining use L was low due to the memory-rewriting device 4 being connected to the ECU 2 and the write switch SW being switched on, execution is transferred as-is to S620, without jumping to the engine-control program in the flash ROM 20a.

Accordingly, in this S620, receipt of the ID sent from the memory-rewriting device 4 as will be described later is awaited, and when the ID is received from the memory-rewriting device 4, execution advances to the subsequent S630, and it is determined whether the ID received from the memory-rewriting device 4 (i.e., the received ID) coincides with the self-held ID stored in the mask ROM 20b (i.e., the internal ID). Accordingly, in a case where the two IDs are determined to coincide, execution advances to S640, and a request signal for requesting sending of the rewrite-control program is sent to the memory-rewriting device 4.

When this occurs, the rewrite-control program is sent from the memory-rewriting device 4 to the ECU 2 as will be described later, and so in the subsequent S650, the rewrite-control program is received from the memory-rewriting device 4, and is copied to and stored in a predetermined region of the RAM 22.

In the subsequent S660, execution jumps to the rewrite-control program stored in the RAM 22 in S650.

Owing thereto, the rewrite-control program sent from the memory-rewriting device 4 is executed in the RAM 22, and the rewrite processing of S800 for rewriting the present control program and control data stored in the flash ROM 20a with the new control program and control data sent from the memory-rewriting device 4 is performed.

The rewrite processing of S800 is performed in a sequence such as, for example, the following.

1. First, the program and data stored in the flash ROM 20a are deleted in accordance with a delete instruction from the memory-rewriting device 4.
2. Next, sending of the new control program and control data from the memory-rewriting device 4 is awaited, and when these are received, the received control program and control data are sequentially written to a storage region of the flash ROM 20a where the former program and data were stored.
3. Accordingly, when the control program and control data have been received in their entirety from the memory-rewriting device 4 and rewriting of the flash ROM 20a has been completed, thereafter all processing is ended.

Accordingly, the control program and data stored in the flash ROM 20a are rewritten with the new control program and control data from the memory-rewriting device 4 by execution of this rewrite processing on S800.

Meanwhile, in a case where it is determined in step S630 of the boot program that the ID (received ID) sent from the memory-rewriting device 4 and the self-held ID (internal ID) stored in the mask ROM 20b do not coincide, execution is transferred to S670. Accordingly, in this S670, an error signal indicating that the ID from the memory-rewriting device 4 and the ID on the ECU 2 side do not coincide is sent to the memory-rewriting device 4, and thereafter, the relevant processing on the ECU 2 side is ended.

Next, when the memory-rewriting device 4 is connected to the ECU 2 by the operator and the rewrite switch SW is switched on, the microprocessor 30 executes the processing shown in FIG. 6.

First, in S900, the ID of the ECU conforming to the new control program and control data stored in the second RAM 36 (i.e., the ID of the ECU which is the data-rewrite target) is read from the second RAM 36, and this read ID (internal ID) is sent to the ECU 2.

When this occurs, it is determined on the ECU 2 side whether'the ID sent from the memory-rewriting device 4 to the ECU 2 and the ID stored in the self-held mask ROM 20b coincide (S630). When the two IDs coincide, the request signal of the rewrite-control program is sent to the relevant memory-rewriting device 4 (S640). When the two IDs do not coincide, an error signal is sent to the memory-rewriting device 4 (S670), and so on the memory-rewriting device 4 side, in the subsequent S910, the signal (request signal or error signal) sent from the ECU 2 is received and the signal type thereof is determined.

Accordingly, when the signal from the ECU 2 is the request signals of the rewrite-control program, execution advances to S920 and the rewrite-control program stored in the first ROM 34 is sent to the ECU 2. Furthermore, in the subsequent S930, after the above-described delete instruction has been sent to the ECU 2, the new control program and control data stored in the second ROM 36 are sent to the ECU 2.

When this occurs, on the ECU 2 side the control program and control data stored in the flash ROM 20a are rewritten with the new control program and control data sent from the memory-rewriting device 4 due to the above-described rewrite processing of S800 in FIG. 5 (i.e., due to execution of the rewrite-control program).

Accordingly, when the foregoing processing of S930 is finished, all processing on the memory-rewriting device 4 side is ended.

Meanwhile, when it has been determined in S910 that the signal from the ECU 2 is an error signal, execution is transferred to S940. An error message indicating that rewriting of the data cannot be performed is shown on a predetermined display device (not shown), and thereafter the processing on the memory-rewriting device 4 side is completed.

In such a memory-rewriting system 5 according to the second embodiment, in a case where the control program and control data stored in the flash ROM 20a of the ECU 2 is rewritten, the operator first mounts the first ROM 34 where the rewrite-control program to be executed on the ECU 2 side is stored in the IC socket 38 of the memory-rewriting device 4, and along with this, mounts the second ROM 36 where the new control program and control data together with the ID of the ECU conforming thereto are stored in the IC socket 40. Accordingly, the memory-rewriting device 4 is connected to the ECU 2 and the rewrite switch SW of the memory-rewriting device 4 is switched on, and along with this, the vehicle's ignition switch is actuated and the ECU 2 is operated from an initial state.

When this occurs, the ID of the ECU conforming to the new control program and control data stored in the second RAM 36 is sent from the memory-rewriting device 4 to the ECU 2 (S900), and ECU 2 determines whether the ID from the memory-rewriting device 4 coincides with the self-held ID stored in the mask ROM 20b (S630).

Accordingly, when the two IDs coincide (S630: "YES"), a request signal for the rewrite-control program is sent from the ECU 2 to the memory-rewriting device 4 (S640), and in response thereto, the rewrite-control program is sent from the memory-rewriting device 4 to the ECU 2 (S910: request signal, S920).

Thereafter, at the ECU 2, the rewrite-control program is copied from the memory-rewriting device 4 to the RAM 22 and executed (S650, S660, and S800), and at the memory-rewriting device 4, sending of the new control program and control data to the ECU 2 is performed (S930). Data rewriting of the flash ROM 20a mounted in the ECU 2 is performed by such operation of the two devices.

In contrast thereto, in a case where the ID sent from the memory-rewriting device 4 and the ID incorporated within the ECU 2 do not coincide (S630: "NO"), the ECU 2 sends an error signal to the memory-rewriting device 4 and ends all processing (S670), and the memory-rewriting device 4, upon receiving the error signal from the ECU 2 (S910 error signal), performs error-message display without sending the rewrite-control program to the ECU 2 (S940).

As has been described in detail above, in the memory-rewriting system 5 according to the second embodiment, firstly, the memory-rewriting device 4 sends the ID of the ECU conforming to the new control program and control data, and the ECU 2 determines whether the ID sent from the memory-rewriting device 4 coincides with the self-held ID stored in the mask ROM 20b. Accordingly, the ECU 2 sends the send request of the rewrite-control program to the memory-rewriting device 4, and along with this, copies the rewrite-control program sent from the memory-rewriting device 4 in accordance thereto to the RAM 22 and executes the rewrite-control program solely in a case wherein the ECU 2 has determined that the ID from the memory-rewriting device 4 and the self-held ID coincide, and owing thereto, thereafter rewrites the control program and control data in the flash ROM 20a with the new control program and control data sent from the memory-rewriting device 4.

Consequently, according to such an ECU 2 and memory-rewriting system 5 of this second embodiment, in a case where the operator has mounted in the IC socket 40 of the memory-rewriting device 4 the ROM (second ROM) 36 wherein a control program and control data which do not conform to the ECU 2 are stored and this nonconforming control program and control data are sent to the ECU 2, the ID on the memory-rewriting device 4 side (that is to say, the ID previously stored in the second ROM 36 in correspondence with the new control program and so on) and the ID of the ECU 2 stored in the mask ROM 20b do not coincide, and so there is no transfer to the operation for copying the rewrite-control program to the RAM 22 in the ECU 2. Accordingly, the control program and control data in the flash ROM 20a can reliably be prevented from being erroneously rewritten by this control program and control data which do not conform to the ECU 2.

In a case where such rewriting of the control program and control data is not performed, it is sufficient for the operator to change the second ROM 36 on the memory-rewriting device 4 side to one where the control program and control data conforming to the ECU 2 are stored, and thereafter again perform the operation for rewriting.

Furthermore, the ECU 2 according to the second embodiment is structured to perform rewrite processing to rewrite the data in the flash ROM 20a by copying the rewrite-control program sent from the memory-rewriting device 4 to the nonvolatile RAM 22 and starting the rewrite-control program, and so the rewrite-control program copied to the RAM 22 is lost when the power to the ECU 2 is interrupted after the operation to rewrite the contents of the flash ROM 20a has been completed. Thus, according to the ECU 2 of the second embodiment, loss or alteration of the correct control program or control data stored in the flash ROM 20a can reliably be prevented even in the event that the CPU 18 executing the program runs uncontrollably after the supply of power to the ECU 2 has been started at an ordinary time to control the engine, because the rewrite-control program for performing rewrite processing is embedded.

With the ECU 2 and the memory-rewriting system 5 according to the second embodiment, the ECU 2 receives the ID from the memory-rewriting device 4 and determines whether this ID coincides with the self-held ID (i.e., the ID stored in the mask ROM 20b). Because the ID stored in the mask ROM 20b is not sent to an external portion, behavior wherein the ID on the ECU 2 side is decoded and the control program or the like in the flash ROM 20a is deliberately rewritten with something else can reliably be prevented.

For similar reasons, behavior can be prevented in which, for example, a program for performing read processing to read the data in the flash ROM 20a and send this data to an external portion is copied to the RAM 22 of the ECU 2 and executed and the stored contents of the flash ROM 20a are incorrectly read, and confidentiality can be heightened.

Meanwhile, with the memory-rewriting system 5 according to the second embodiment, when the ECU 2 determines that the ID from the memory-rewriting device 4 and the ID on its own side do not match, the ECU 2 sends an error signal to the memory-rewriting device 4, and when the memory-rewriting device 4 receives the error signal from the ECU 2, the memory-rewriting device 4 performs error-message display on a display device.

Consequently, the operator can reliably become aware of nonconformity with the ECU 2 of the new control program and control data readied to perform rewriting due to the error display on the memory-rewriting device 4 side.

(Third Embodiment)

A memory-rewriting system of an electronic control unit according to a third embodiment will be described next. The memory-rewriting system according to the third embodiment differs from the above-described memory-rewriting system 5 according to the second embodiment solely in the processing executed respectively on the ECU 2 side and the memory-rewriting device 4 side, and is completely identical with respect to structure of hardware. in this regard, processing executed by the microprocessor 8 on the ECU 2 side and processing executed by the microprocessor 30 on the memory-rewriting device 4 side in the memory-rewriting system according to the third embodiment will be described hereinafter with reference to FIGS. 7 and 8.

Figure 7:
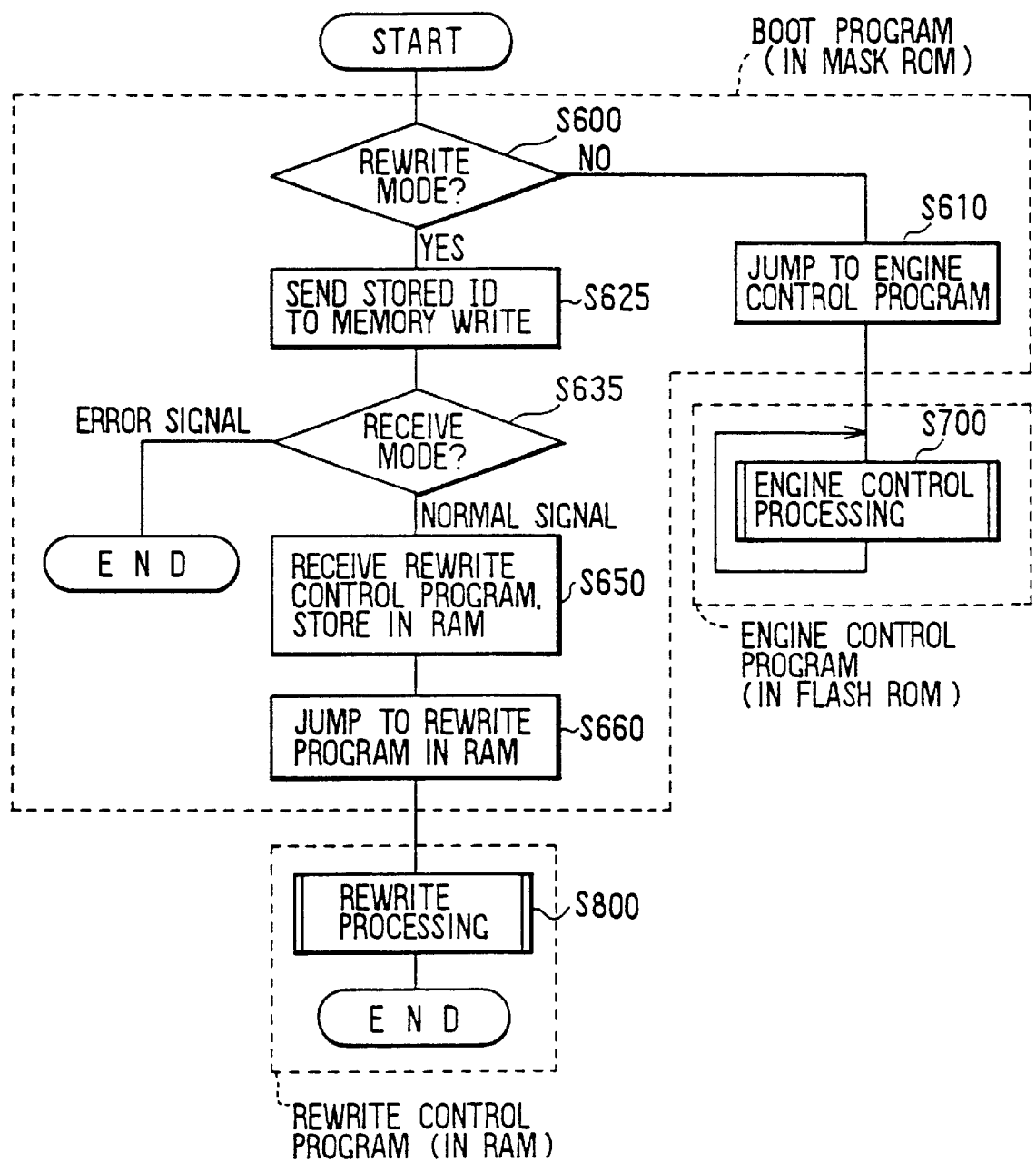
FIG. 7 is a flowchart of processing executed on an engine-control unit (ECU) side in a third preferred embodiment of the present invention.
Figure 8:
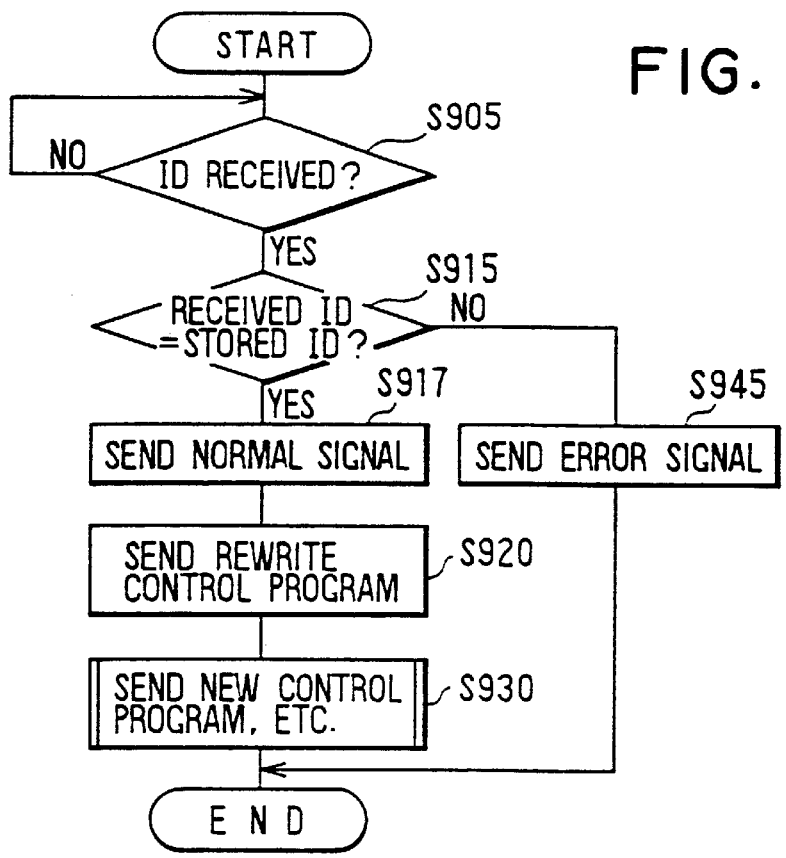
FIG. 8 is a flowchart of processing executed on a memory-rewriting device side in the third embodiment.

FIG. 7 is a flowchart of processing executed by the microprocessor 8 of the ECU 2. Because identical step numbers are attached with respect to processing which is identical to FIG. 5 of the second embodiment, detailed description thereof will be omitted. FIG. 8 is a flowchart showing processing executed by the microprocessor 30 of the memory-rewriting device 4, and because identical step numbers are attached with respect to processing which is identical to FIG. 6 of the second embodiment, detailed description thereof will be omitted.

Firstly, as shown in FIG. 7, in a case where the microprocessor 8 of the ECU 2 has determined in S600 immediately after a reset start that the rewrite mode is in effect, execution is transferred to S625 without jumping to the control program in the flash ROM 20a.

Accordingly, in this S625, the self-held ID stored in the memory-writing device is sent to the memory-rewriting device 4, and in the subsequent S635, it is determined whether a signal (acknowledge signal) sent from the memory-rewriting device 4 as will be described later is a normal signal or an error signal.

In a case where the signal from the memory-rewriting device 4 was determined to be a normal signal in S635, processing is performed to rewrite the control program and control data stored in the flash ROM 20a with the new control program and control data sent from the memory-rewriting device 4 by the processing of S650, S660, and S800, namely, copying the rewrite-control program sent from the memory-rewriting device 4 to the RAM 22 and storing the rewrite-control program in the RAM 22, and executing the rewrite-control program in the RAM 22.

In contrast thereto, in a case where the signal from the memory-rewriting device 4 was determined to be an error signal, the processing on the ECU 2 side is ended with no further execution.

Next, as shown in FIG. 8, the microprocessor 30 of the memory-rewriting device 4 first awaits receipt of the ID sent from the ECU 2, and when the ID from the ECU 2 is received, execution advances to S915 and the microprocessor 30 of the memory-rewriting device 4 determines whether the ID received from the ECU 2 (i.e., the received ID) and the ID of the ECU stored in the second RAM 36 (i.e., the internal ID) coincide.

Accordingly, in a case where the two IDs have been determined to coincide, execution advances to S917, and a normal signal indicating that the ID on the memory-rewriting device 4 side and the ID on the ECU 2 side coincide is sent to the ECU 2.

When this occurs, the microprocessor 8 on the ECU 2 side begins execution of the processing of S650 and after in FIG.

7, as has been described above, and so after the normal signal has been sent on the memory-rewriting device 4 side in the above-described S917, the processing of S920 and S930 is executed and the rewrite-control program stored in the first ROM 34 and the new control program and control data stored in the second ROM 36 are sequentially sent to the ECU 2, similarly to the case of the second embodiment Meanwhile, in a case where the ID from the ECU 2 (i.e., the received ID) and the ID of the ECU stored in the second RAM 36 (i.e., the internal ID) have been determined in S915 not to coincide, execution is transferred to S945, and after an error signal indicating that the ID on the memory-rewriting device 4 side and ID on the ECU 2 side do not coincide has been sent to the ECU 2, the processing on the memory-rewriting device 4 side is ended with no further execution. When this occurs, all processing in the ECU 2 is ended without executing the processing of S650 or thereafter in FIG. 7, as was described above.

That is to say, according to the memory-rewriting system of the third embodiment, opposite to the memory-rewriting system 5 of the second embodiment, the ECU 2 sends the self-held ID to the memory-rewriting device 4 (S625) and the memory-rewriting device 4 determines whether the ID from the ECU 2 and the ID of the ECU conforming to the new control program and control data coincide (S915). Accordingly, in a case where the two IDs coincide (S915: "YES"), the memory-rewriting device 4 sends a normal signal to the ECU 2 (S917) and thereafter sends the rewrite-control program and the new control program and control data (S920 and 5930). The ECU 2, solely in a case where the ECU 2 has received the normal signal from the memory-rewriting device 4 (S635: normal signal), determines whether the ID of the memory-rewriting device 4 side and the 34. self-held ID coincide, and performs processing to copy the rewrite-control program from the memory-rewriting device 4 to the RAM 22 and execute the rewrite-control (S650 and S660).

According to such an ECU 2 and memory-rewriting system of the third embodiment as well, similar to the second embodiment, in a case where the operator has mounted in the IC socket 40 of the memory-rewriting device 4 the ROM 36 wherein a control program and control data which do not conform to the ECU 2 are stored and this nonconforming control program and control data are sent to the ECU 2, the ID on the memory-rewriting device 4 side (that is to say, the ID previously stored in the second ROM 36 in correspondence with the new control program and so on) and the ID of the ECU 2 stored in the mask ROM 20b do not coincide, and so there is no transfer to the operation for copying the rewrite-control program to the RAM 22 in the ECU 2. Accordingly, the control program and control data in the flash ROM 20a can reliably be prevented from being erroneously rewritten by this control program and control data which do not conform to the ECU 2.

Furthermore, in the ECU 2 according to the third embodiment as well, similarly to the ECU 2 according to the second embodiment, is structured to perform rewrite processing of the flash ROM 20a by copying the rewrite-control program sent from the memory-rewriting device 4 to the nonvolatile RAM 22 and starting the rewrite-control program, and so loss or alteration of the correct control program or control data stored in the flash ROM 20a can reliably be prevented even in the event that the CPU 18 executing the program runs uncontrollably after the supply of power to the ECU 2 has been started at an ordinary time to control the engine.

In the above-described second embodiment, the ID on the memory-rewriting device 4 side may be input by operating a predetermined input device, without being previously stored in the second ROM 36.

Accordingly, because copying of the rewrite-control program to the RAM 22 by the ECU 2 is not permitted even by such a memory-rewriting system unless an ID identical to the ID stored in the mask ROM 20b of the ECU 2 is sent from the memory-rewriting device 4 to the ECU 2, behavior where the data (i.e., the control program and control data) in the flash ROM 20a is inadvertently rewritten or deliberately rewritten with other data can reliably be prevented.

Meanwhile, the ECU 2 of the above-described second or third embodiment was provided with the flash ROM 20a as the nonvolatile memory wherein data is electrically writable, but it is also acceptable to employ an EEPROM.

Additionally, according to the foregoing embodiments, examples having respectively the mask ROM 20b and the flash ROM 20a within the ECU 2 were indicated, but it is also acceptable to dispose solely the flash ROM 20a and cause the above-described contents (program, ID, and so on) of the mask ROM 20b to be stored in the flash ROM 20a in a region separately from the engine-control program.

Further, an ECU 2 to control an engine was described in the foregoing second and third embodiments, but the scope of application of this invention is not exclusively restricted thereto. That is to say, this invention can be applied completely identically in an electronic control unit to control a controlled object of for example a brake, a transmission, a suspension, or the like.

(Fourth Embodiment)

Figure 9:
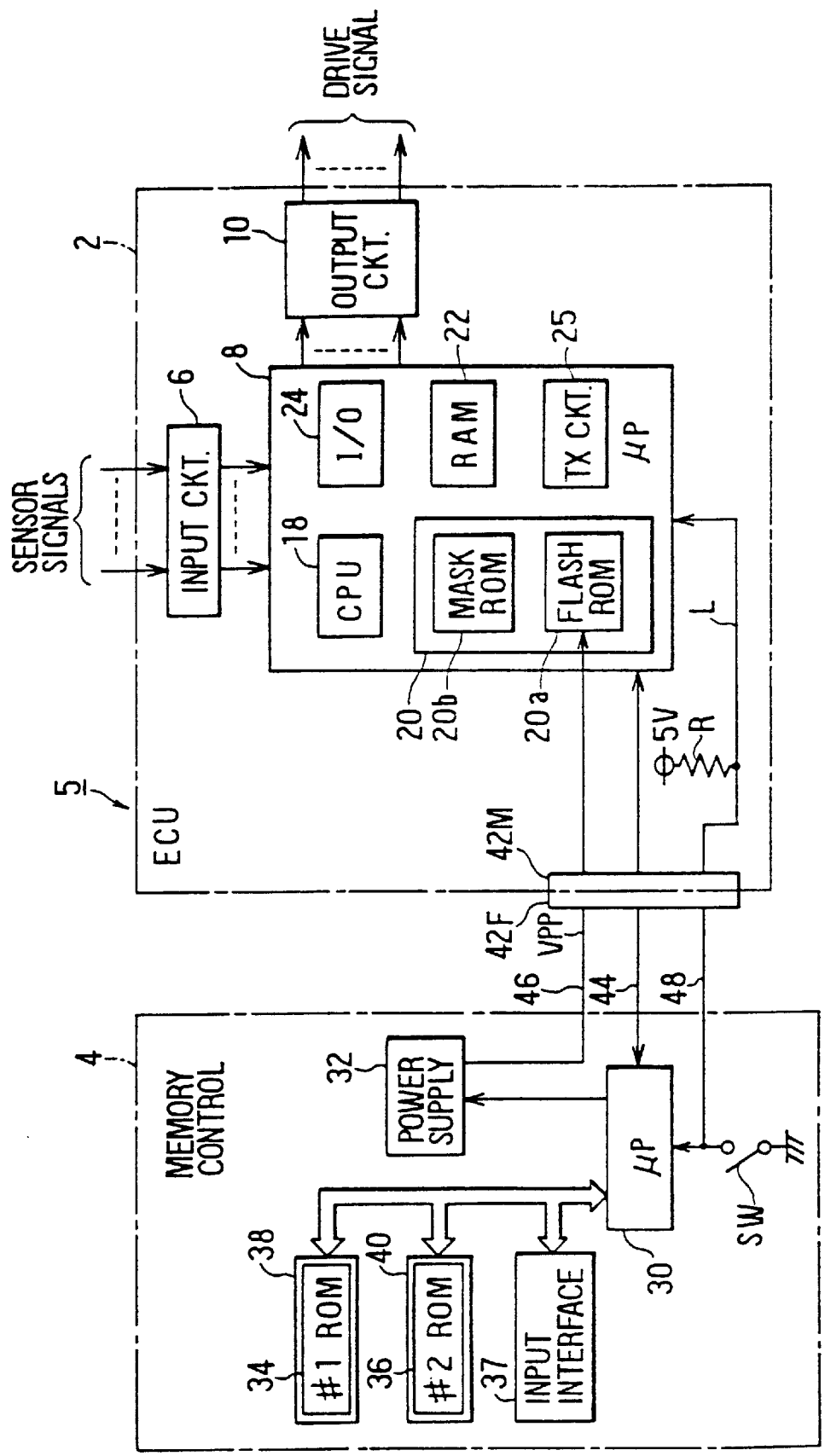
FIG. 9 is a block diagram of the overall structure of a memory-writing system of an electrical device according to a fourth preferred embodiment of the present invention.

The overall structure of a fourth preferred embodiment of the present invention as well is substantially similar to the overall structure of the first embodiment shown in FIG. 1. However, as shown in FIG. 9, the memory-rewriting device 4 differs in having an input device 37 for the operator to perform input of various instructions to the memory-rewriting device 4 in addition to the structure described for the first embodiment.

According to this embodiment, data of 1 byte (=8 bits) per address location is stored in the flash ROM 20a.

Next, the processing executed by the microprocessor 30 of the memory-rewriting device 4 and the processing executed by the microprocessor 8 of the ECU 2 will be described with reference to the flowcharts of FIG. 10–13. The processing of S1300 through S1350 thereof is executed by the boot program in the mask ROM 20b, and the processing of S1400 is executed by the engine-control program in the flash ROM 20a. Accordingly, the processing of S1500 through S1740 is executed by a rewrite-control program sent from the memory-rewriting device 4 and stored in the RAM 22.

Figure 10:
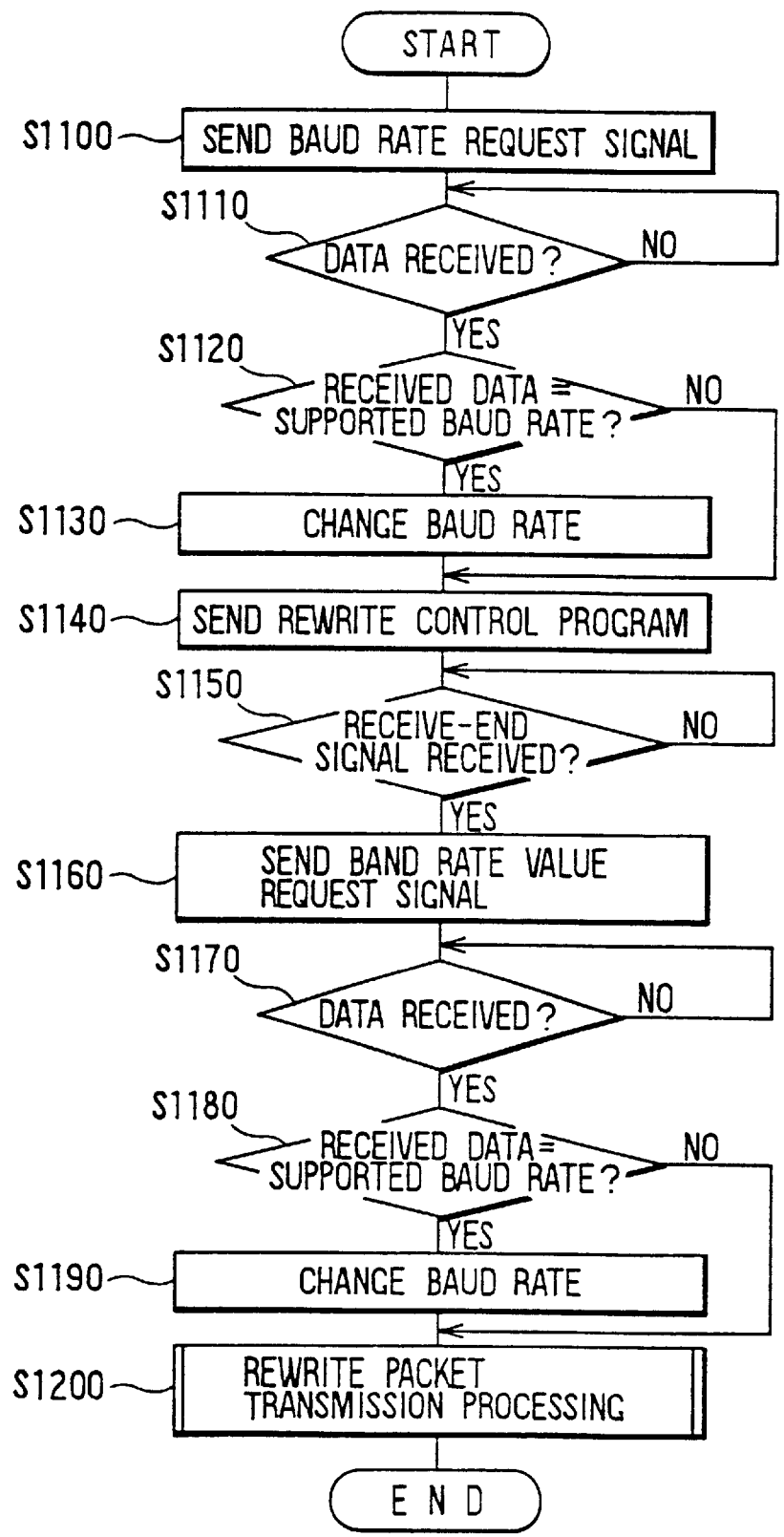
FIG. 10 is a flowchart of processing executed on a memory-rewriting device side according to the fourth embodiment.

Firstly, when the memory-rewriting device 4 is connected to the ECU 2 by the operator and the rewrite switch SW is switched on, the microprocessor 30 executes the processing shown in FIG. 10. According to this embodiment, the communication speed (hereinafter termed "baud rate") of the data communication performed between the memory-rewriting device 4 and the ECU 2 is initially mutually established at 9,600 bps.

As shown in FIG. 10, first in the initial S1100 the microprocessor 30 of the memory-rewriting device 4 sends to the ECU 2 a baud-rate request signal indicating the value of the baud rate supportable by the ECU.

In the subsequent S1110, receipt of data from the ECU 2 is awaited. When the data is received, execution advances to the subsequent S1120 and it is determined whether this received data is a signal indicating a baud rate supportable by the ECU 2 (hereinafter termed a "supported baud-rate value signal"). When the received data is the supported baud-rate value signal, in the subsequent S1130 the baud rate on the memory-rewriting device 4 side is changed to a value indicating the foregoing supported baud-rate value signal that was received. That is to say, after the ECU 2 according to this invention has sent the supported baud-rate value signal to the memory-rewriting device 4 as will be described later, its own baud rate is changed to a value indicating the foregoing supported baud-rate value signal that was sent, and so even on the memory-rewriting device 4 side the baud rate employed in communication is changed to a value indicating the supported baud-rate value signal received from the ECU 2, and communication thereafter is established.

Accordingly, when the processing of S1130 is executed or it is determined in S1120 that the received data is not the supported baud-rate value signal, execution is transferred to S1140, the write-control program is read from the first ROM 34, and this rewrite-control program that has been read is sent to the ECU 2. Upon sending this rewrite-control program, when communication thereafter is performed at the baud rate changed in S1130 when the processing of S1130 has been executed (S1120: "YES"), or is performed at the same 9,600 bps as the initial S1100 when the processing of S1130 has not been executed (S1120:

When the sending of the rewrite-control program in this S1140 has ended completely, execution advances to S1150 and the sending of a receive-end signal indicating that receipt of the rewrite-control program from the ECU 2 has ended is awaited. When this receive-end signal is received, execution advances to S1160, and a baud-rate value request signal is sent to the ECU 2, similarly to the case in S1100.

In the subsequent S1170, the receipt of data from the ECU 2 is awaited. When the data is received, it is determined in the subsequent S1180 whether this received data is the supported baud-rate value signal. When the received data is the supported baud-rate value signal, execution advances to S1190 and the baud rate on the memory-rewriting device 4 side is changed to a value indicating the supported baud-rate value signal that was sent. That is to say, in S1160 through S1190, processing completely identical to the above-described S1100 through S1130 is performed.

Accordingly, when the processing of S1190 is executed or it is determined in S1180 that the received data is not the supported baud-rate value signal, execution is transferred to S1200, packet-sending processing for the write data is performed, and thereafter the processing on the memory-rewriting device 4 side is ended.

Herein, the packet-sending processing for the write data of S1200 is processing to read each n bytes of the write data stored in the second ROM 36, and packetize and send this write data of n bytes to the ECU 2 as shown in FIG. 14. In FIG. 14, "HD" is a header of a number of bytes appended to the write data of n bytes of data 1, data 2, . . . data n. Information for communication-control use of a code or the like indicating the copy destination of the relevant data is disposed in this header HD. Accordingly, "CS" is a checksum (data for detection use) of 1 byte or of a number of bytes for detecting communication error. Additionally, communication with the ECU 2 in the packet-sending processing is performed at the baud rate changed in S1190 when the processing of S1190 has been executed (S1180: "YES"), or is performed at the same 9,600 bps as the initial S1100 or at the baud rate changed in S1130 when the processing of S1190 has not been executed (S1180: "NO").

Figure 11:
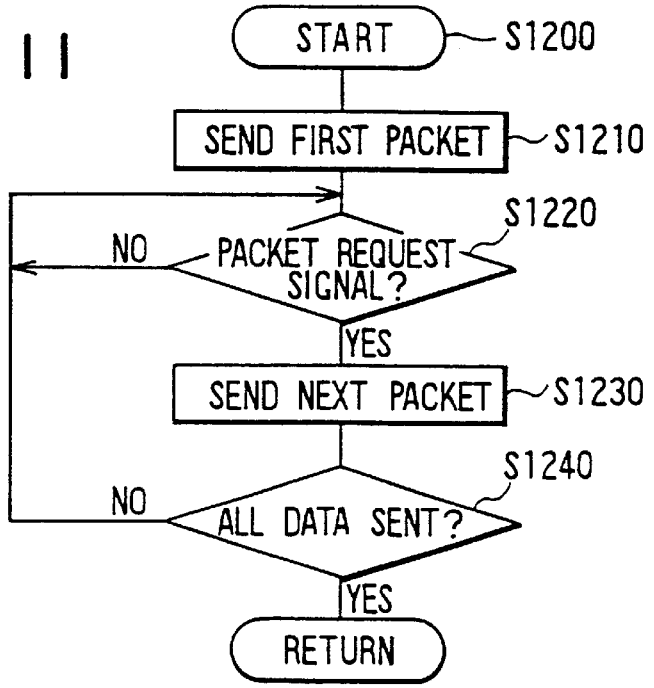
FIG. 11 is a flowchart of packet-sending processing for write data executed in the processing of FIG. 10.

As shown in FIG. 11, when execution of the packet-sending processing for the write data is started, first in S1210, the initial n bytes of the write data are read from the second ROM 36, one packet is formed by appending the header HD and the checksum CS shown in FIG. 14 to this write data of n bytes, and this packet is sent to the ECU 2.

In the subsequent S1220, the sending of a packet request as a request signal from the ECU 2 for requesting the next packet is awaited. When the packet request is received from the ECU 2, execution advances to S1230, the next n bytes of the write data are read from the second ROM 36, and this write data of n bytes is packetized similarly to the case of S1210 and sent to the ECU 2.

In the subsequent S1240, it is determined whether the sending of all write data stored in the second ROM 36 has finished. When not all data has been sent yet, the processing of S1220 and S1230 is repeated. In a case where it has been determined in S1240 that the sending of all data has ended, execution returns from this packet-sending processing to the processing of FIG. 9, and thereafter the processing on the memory-rewriting device 4 is ended.

Meanwhile, when the power supply is next actuated at the ECU 2, the microprocessor 8 begins to operate from a reset state and the processing shown in FIG. 12 is executed.

That is to say, initially the boot program stored in the mask ROM 20b is started, and first in S1300, it is determined whether the rewrite mode is in effect by determining whether the signal line for mode-determining use L is at a low level. Accordingly, when the signal line for mode-determining use L is not low (S1300: "NO"), the mode is determined to be not the write mode but rather the normal mode, and execution jumps to the engine-control program.

When this occurs, the control program stored in the flash ROM 20a is started, and thereafter, as shown in S1400, engine-control processing referencing the control data for engine-control use is executed. This engine-control processing is executed in a sequence wherein optimal fuel-injection amount, ignition timing, and so on for the engine are calculated on a basis of the various sensor signals from the input circuit 6 and the control data stored in the flash ROM 20a, and control signals for driving the actuators for the injector, the igniter, and so on are output to the output circuit 10 in accordance with this calculation result.

Meanwhile, in a case where the system is determined in the foregoing S1300 to be in the write mode in the boot program, that is to say, in a case where the signal line for mode-determining use L was low due to the memory-writing device 4 being connected to the ECU 2 and the write switch SW being switched on, execution is transferred to S1310.

Accordingly, in this S1310, receipt of the baud-rate request signal sent from the memory-rewriting device 4 in the above-described S1100 of FIG. 10 is awaited. When the baud-rate request signal is received, execution advances to S1320, and the signal (supported baud-rate value signal) indicating the self-held baud rate to be changed or established in the subsequent S1330 is sent to the memory-rewriting device 4, and in the subsequent S1330, the self-held baud rate is changed to a value indicating the foregoing supported baud-rate value signal that has been sent.

When this occurs, the rewrite-control program from the memory-rewriting device 4 in the above-described S1140 of FIG. 10 is sent at the foregoing changed baud rate, and so in the subsequent S1340, this rewrite-control program is received and sequentially stored in a predetermined region of the RAM 22. Further, the receipt and the communication thereafter of this rewrite-control program is performed at the baud rate changed in S1330.

Accordingly, when this storing of this rewrite-control program in the RAM 22 in S1340 has been completely finished, in the subsequent S1350 execution jumps to the write-control program stored in the RAM 22 in S1340.

Because of this, the write-control program sent from the memory-rewriting device 4 is executed in the RAM 22, and the processing of S1500 through S1540 (and moreover, the processing of S1550 through S1740 in FIG. 13) is performed.

That is to say, first in S1500, the receive-end signal indicating that receipt of the rewrite-control program has ended is sent to the memory-rewriting device 4, and in the subsequent S1510, receipt of the baud-rate request signal sent from the memory-rewriting device 4 in the above-described S1160 of FIG. 10 is awaited. When the baud-rate request signal is received, execution advances to S1520 and the supported baud-rate value signal indicating the self-held baud rate to be changed and set in the subsequent S1530 is sent to the memory-rewriting device 4. Next, in S1530, the self-held baud rate is changed to a value indicating the foregoing supported baud-rate value signal that has been sent.

When this occurs, the packetized write data from the memory-rewriting device 4 in the above-described S1200 of FIG. 10 is sent at the foregoing changed baud rate, and so in the subsequent S1540, data-rewrite processing for rewriting the data in the flash ROM 20a with the write data sent from the memory-rewriting device 4 is executed, and thereafter the processing on the ECU 2 side is ended.

Figure 13:
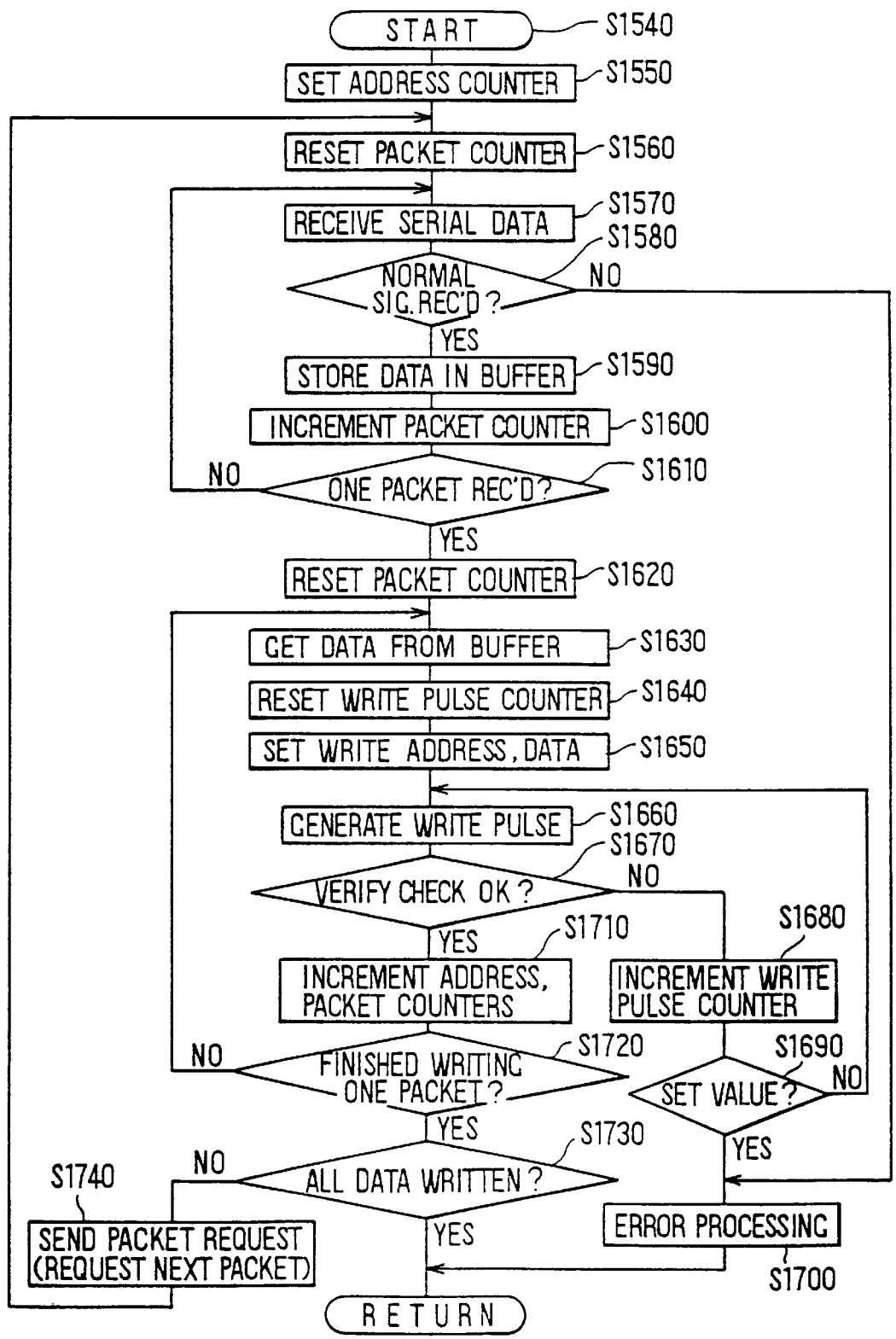
FIG. 13 is a flowchart of data-rewrite processing executed in the processing of FIG. 11.

Herein, the data-rewrite processing of S1540 is performed in the sequence indicated in FIG. 13. Further, communication with the memory-rewriting device 4 in this data-rewrite processing is performed at the baud rate changed in S1540.

Namely, as shown in FIG. 13, when execution of the data-rewrite processing is started, firstly in S1550 the value of the starting address where the writing of new data to the flash ROM 20a is to begin is set to an address counter for counting the write destination (i.e., the write address) of the data in the flash ROM 20a, and subsequently in S1560, a packet counter for determining whether processing has ended for the write data of one packet (that is, n bytes) is reset.

In the subsequent S1570, a one-byte portion of the serial data sent from the memory-rewriting device 4 in the above-described packet-sending processing of FIG. 11 is received, and in the subsequent S1580 it is determined whether the receive state is normal. Accordingly, in a case of normal reception, execution advances to S1590, and when the one byte of data received in S1570 is write data to be written to the flash ROM 20a (or, stated differently, when the data is other than the header HD or the checksum CS), this one byte of write data is sequentially stored from the start of a buffer region of n bytes established in a predetermined region of the RAM 22, and in the subsequent S1600, the above-described packet counter reset the S1560 is incremented.

Next, in S1610, it is determined whether a one-packet portion (n bytes) of write data has been received and stored in the buffer region of the RAM 22 by determining whether the value of the packet counter has reached "n," and the processing of S1570 through S1600 is repeated in a case where a one-packet portion has not been received and stored.

Meanwhile, in a case where it has been determined in S1610 that the value of the packet counter has reached "n," a one-packet portion of write data has been received and stored in the buffer region of the RAM 22, and so execution advances to S1620 and the packet counter is reset.

In the subsequent S1630, a one-byte portion of the write data is sequentially read from the start of the buffer region, and in the subsequent S1640, a write-pulse counter for counting how many times a write operation for a one-byte portion of data has been performed for the flash ROM 20a is reset.

Accordingly, in the subsequent S1650, the current value of the address counter is set as the write address, and along with this, the one-byte portion of write data taken from the buffer region in S1630 is set as the one-byte data now to be written to the flash ROM 20a, and in the subsequent S1660, a write pulse is applied to the cell in the flash ROM 20a specified by the write address set in S1650.

When this occurs, the one-byte data set in S1650 is written to the region of the write address similarly set in S1650, but because the possibility exists that the data could not be accurately written by applying the write pulse only once, in the subsequent S1670 a so-called verify check is performed to compare the current write data taken from the buffer region in S1630 with the one-byte data actually written to the flash ROM 20a.

Accordingly, when the foregoing two data items do not coincide according to the verify check of S1670 (S1670: "NO"), execution is transferred to S1680 and the write-pulse counter is incremented. Next, in S1690, it is determined whether the value of the write-pulse counter has reached a predetermined value (according to this embodiment, "10"), and when the predetermined value has not been reached, execution returns to S1660 and a data-write operation is again performed for the write data taken from the buffer region in S1630 by again applying a write pulse to the flash ROM 20a.

In a case where the value of the write-pulse counter has reached the predetermined value in S1690, it is determined, because the data could not accurately be written despite the data-write operation of S1660 being performed for the same one-byte data, that some abnormality exists, and execution advances to S1700. Accordingly, after predetermined error processing is performed in this S1700, execution returns from this data-write processing to the processing of FIG. 12, and thereafter the processing on the ECU 2 is ended. Even in a case where the receive state is determined in S1580 not to be normal, execution returns to the processing of FIG. 12 after the foregoing error processing of S1700 has been Performed, and thereafter the processing on the ECU 2 side is ended.

Meanwhile, when the foregoing two data items coincide according to the verify check of S1670 (S1670: "YES"), execution is transferred to S1710, and the address counter and the packet counter are each incremented. In the subsequent S1720, it is determined whether a one-packet portion (n bytes) of write data was able to have been written to the flash ROM 20a (i.e., whether writing of the one-packet portion has ended) by determining whether the value of the packet counter has reached "n." Accordingly, the processing of S1630 through S1710 is repeated in a case where writing of the one-packet portion has not been ended, and execution jumps to S1730 in a case where writing of the one-packet portion has been ended by repeating such processing.

Accordingly, it is determined in this S1730 whether writing of all addresses (or, in other words, all data) has ended by determining whether the value of the address counter has reached a value of an ending address whereat writing of new data in the flash ROM 20a is to be ended. When writing of all addresses has not ended, execution advances to the subsequent S1740 and a packet request for requesting the next packet is sent to the memory-rewriting device.

When this occurs, the next packet is sent from the memory-rewriting device 4 by the above-described processing of FIG. 11, and so the above-described processing of S1560 through S1740 is repeated in the data-rewrite processing. Accordingly, in a case wherein it is determined in S1730 that writing of all addresses has been ended, execution returns from the data-rewrite processing to the processing of FIG. 12, and the processing on the ECU 2 side is ended.

That is to say, in the data-rewrite processing of FIG. 12 executed by the ECU 2 according to this embodiment, n bytes of write data packetized and sent from the memory-rewriting device 4 is received and stored in the buffer region of the RAM 22 (S1560 through S1610), the n bytes of write data stored in this buffer region is sequentially taken in a bytewise manner to be written to the flash ROM 20a (S1620 through S1720), and when the write data in the buffer region has all been written to the flash ROM 20a (S1720: "YES"), a packet request for requesting the next n bytes of write data to be written is sent to the memory-rewriting device 4 (S1740).

Because of this, the memory-rewriting device 4 packetizes and sends to the ECU 2 each n bytes of the write data stored in the second ROM 36 by executing the packet-sending processing of FIG. 11; to go into greater detail, the memory-rewriting device 4 sends each n bytes of the write data by a procedure wherein after an initial packet P has been sent, the subsequent packet P is sent each time that a packet request Y is received from the ECU 2, as shown in FIG. 15. In FIG. 15, the arrows "→" pointing from left to right indicate sending of the packet P from the memory-rewriting device 4 to the ECU 2, and the arrows "←" pointing from right to left indicate sending of the packet request Y from the ECU 2 to the memory-rewriting device 4.

Consequently, according to such a memory-rewriting system 5 provided with an ECU 2, the sending interval on the memory-rewriting device 4 side can be caused to be optimally varied in accordance with time ta, tb, tc, td, . . . required to actually write data on the ECU 2 side as exemplified in FIG. 15, with no need to employ a sending method wherein the memory-rewriting device 4 sequentially sends new write data at a previously determined time interval (that is, a time interval greater than a maximum time required to write received data to the ECU 2 side), and so no waste occurs in the time required to receive and send the write data, and as a result thereof, the data in the flash ROM 20a can be rewritten in a short time.

Moreover, in the ECU 2 according to this embodiment, the data quantity stored at one time in the buffer region of the RAM 22 which is one unit of write data sent from the memory-rewriting device 4 (or in other words, the size of the buffer region) is established at a value which is a multiple of n of the number of bits (according to this embodiment, one byte) of data which is writable to the flash ROM 20a at one time, and a one-byte portion of data is sequentially taken from the buffer region and written to the flash ROM 20a.

Consequently, the number of times that a packet request is sent from the ECU 2 to the memory-rewriting device 4 is reduced, the time required to receive and send rewrite data can be shortened by a corresponding amount, and in turn, rewriting the data in the flash ROM 20a in a shorter time becomes possible. That is to say, rewrite data may be sent from the memory-rewriting device 4 one byte at a time, but in this case, the number of times the packet requests are sent from the ECU 2 to the memory-rewriting device 4 becomes greater, and disadvantageousness is increased by a corresponding amount. In contrast thereto, greater effects can be obtained according to this embodiment.

Ordinarily, with an ECU 2 according to this embodiment, the capacity of the RAM 22 is restricted by aspects such as mounting area and cost, and as a matter of course a limit occurs also in the size of the buffer region (hereinafter termed "buffer size") wherein received write data is stored. Owing thereto, the buffer size cannot employ an unrestrictedly large setting even in order to reduce the number of times packet requests are sent from the ECU 2 to the memory-rewriting device 4.

Herein, examination of the relationship between buffer size (i.e., the data quantity of write data disposed in one packet to be sent from the memory-rewriting device 4) and sending time (i.e., the time until the sending of all data from the memory-rewriting device 4 to the ECU 2 has been ended, and in turn, the total time required to rewrite the flash ROM 20a) with respect to the ECU 2 according to this embodiment reveals that in a case where communication speed (baud rate) is low, as shown in TABLE I below and FIG. 16, an effect wherein the sending time can be shortened is greater the larger is the buffer size, but when the communication speed becomes higher, a greater effect can be obtained even without the buffer size becoming correspondingly large.

TABLE I

| Buffer Size | Transmission Speed | | | |
|---|---|---|---|---|
| | 9600 bps | 19.2 kbps | 38.4 kbps | 115 kbps |
| 2 bits | 512.0 | 256.0 | 128.0 | 42.67 |
| 8 bits | 204.8 | 102.4 | 51.2 | 17.07 |
| 16 bits | 153.6 | 76.8 | 38.4 | 12.8 |
| 64 bits | 115.2 | 57.6 | 28.8 | 9.6 |
| 128 Bits | 108.8 | 54.4 | 27.2 | 9.07 |
| 1024 bits | 103.2 | 51.6 | 25.8 | 8.6 |
| 2048 bits | 102.8 | 51.4 | 25.7 | 8.57 |

TABLE I shows, in units of seconds, calculated values for sending time (rewrite time) in a case of sending a total of 96 bytes of write data from the memory-rewriting device 4 to the ECU 2. The time required to write the received data on the ECU 2 side is estimated as 80 ms. Accordingly, FIG. 16 is a graph of the calculated values of TABLE I.

Consequently, a maximum effect can be obtained from a minimum of resources by establishing the buffer size and the communication speed at optimal values within the permitted range from such a standpoint. For example, according to this embodiment, the buffer size is established at 128 bytes and the communication speed is established at 38.4 kbps, and the sending time of a 96-kbyte portion of data is shortened to 27.2 seconds.

Meanwhile, with the ECU 2 according to this embodiment, rewriting of the flash ROM 20a is performed by receiving from the memory-rewriting device 4 the rewrite-control program for performing the processing to rewrite the data within the flash ROM 20a with the new data sent from the memory-rewriting device 4 and storing and executing this rewrite-control program in the RAM 22 which is not a rewrite target. Therefore, no need exists to previously embed the rewrite-control program, and great economy in memory capacity can be realized.

Meanwhile, moreover, the ECU 2 according to this embodiment is structured so that the baud rate of data communication performed with the memory-rewriting device 4 is a value which is variable in accordance with a change instruction by executing a predetermined change instruction (S1330 and S1530 in FIG. 12). Accordingly, the change instruction for changing the baud rate is disposed in the rewrite-control program sent from the memory-rewriting device 4 prior to the instruction set for performing data-rewrite processing (FIG. 13) to rewrite the data within the flash ROM 20a with new data sent from the memory-rewriting device 4, as shown in S1530 of FIG. 12.

Thus, according to the ECU 2 of this embodiment, the rewrite-control program is sent from the memory-rewriting device 4 at the predetermined baud rate, and when this rewrite-control is stored in the RAM 22, the baud rate of data communication performed with the memory-rewriting device 4 is changed to a value in accordance with the above-described change instruction by the change instruction (S1530) disposed prior to the instruction set for performing data-rewrite processing in the rewrite-control program. Accordingly, the receipt of write data (packets) sent thereafter from the memory-rewriting device 4 and the sending of packet requests to the memory-rewriting device 4 thereafter are performed according to this baud rate after change.

For this reason, when packetizing and sending write data after the memory-rewriting device 4 has sent the rewrite-control program, this packetized data can be sent at the baud rate established by the change instruction disposed in the rewrite-control program, and it becomes possible to copy the write data to the ECU 2 side more rapidly by setting the baud rate established by this change instruction to a faster baud rate than in a case where performing communication of the rewrite-control program.

According to the ECU 2 of this embodiment, the baud rate of data communication performed with the memory-rewriting device 4 can be speeded up as desired, and it becomes possible to further shorten the total time required to rewrite the data in the flash ROM 20a.

Accordingly, moreover, in the ECU 2 according to this embodiment, a send instruction to send a signal (supported baud-rate value signal) indicating the baud rate of the ECU 2 established by the change instruction is disposed in the rewrite-control program send from the memory-rewriting device 4 prior to the change instruction of S1530, as shown in S1520 of FIG. 12, and the ECU 2 sends the supported baud-rate value signal to the memory-rewriting device 4 by executing this send instruction.

Thus, prior to the baud rate being changed at the ECU 2, the supported baud-rate value signal indicating the new baud rate established thereafter comes to be sent to the memory-rewriting device 4 at the baud rate theretofore (that is to say, the baud rate in a case of performing the communication of the rewrite-control program), and the memory-rewriting device 4 can automatically switch its own baud rate in accordance with the supported baud-rate value signal from the ECU 2, as shown in S1180 and S1190 of FIG. 10. Consequently, according to the ECU 2 of this embodiment, data communication with the memory-rewriting device 4 can be caused to be reliably established.

According to the Ecu 2 of this embodiment, processing for changing the baud rate which is completely identical to S1510 through S1530 of the rewrite-control program is performed in S1310 through S1330 of the boot program as well, as shown in FIG. 12, and in contrast thereto, according to the memory-rewriting device 4, processing which is completely identical to S1160 through S1190 is performed in S1100 through S1130 as well, as shown in FIG. 10. Due to this, accordingly, the baud rate during copying of the rewrite-control program from the memory-rewriting device 4 to the ECU 2 also is variable, but the processing of S1310 through S1330 of FIG. 12 and the processing of S1100 through S1130 of FIG. 10 may be omitted so that the rewrite-control program is copied at the communication initial baud rate of 9,600 bps.

Additionally, the ECU 2 according to this embodiment is provided with the flash ROM 20a as the nonvolatile memory in which data is electrically writable, but it is also acceptable to employ an EEPROM, and it is also acceptable to employ a PROM (for example a one-time PROM) having at least one or more writable regions.

Although the present invention has been fully described in connection with the preferred embodiments thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. A memory writing control system comprising:

write data acquiring means for receiving a rewrite control program and a first amount of write data from an external device, the acquiring means having a memory area to receive and store the first amount of write data;

first baud rate setting means for setting a first baud rate of communication between the acquiring means and the external device when the rewrite control program is sent to the acquiring means from the external device;

second baud rate setting means for setting a second baud rate of communication between the acquiring means and the external device when the write data is sent to the acquiring means from the external device;

a nonvolatile memory;

writing means connected to the write data acquiring means and the nonvolatile memory, the writing means for using the rewrite control program to sequentially write a second amount of write data from the memory area to the nonvolatile memory, the writing means writing the data to the nonvolatile memory by sequentially extracting each of a plurality of bytes of data from the memory area and writing the bytes of data to the nonvolatile memory, the first amount of write data being a multiple of the second amount of write data;

determining means for determining whether the first amount of write data stored in the memory area has been written to the nonvolatile memory; and request signal sending means for sending a request signal to the external device, the external device responsive to the request signal to send the first amount of write data to the acquiring means.

2. The system of claim 1, wherein the second baud rate of communication is the same or faster than the first baud rate of communication.

3. The system of claim 1, wherein the rewrite control program is stored in the memory area, and the second baud rate setting means sets the second baud rate after the rewrite control program is stored in the memory area.

4. The system of claim 1, wherein the acquiring means receives a first baud rate request signal from the external device and sends a first supported baud rate signal to the external device, the first baud rate request signal indicating a self-held baud rate of the acquiring means wherein the first baud rate setting means sets both the acquiring means and the external device to the first baud rate after the acquiring means sends the first supported baud rate signal to the external device.

5. The system of claim 2, wherein the acquiring means receives a second baud rate request signal from the external device and sends a second supported baud rate signal to the external device, the second supported baud rate signal indicating a self-held baud rate of the acquiring means, wherein the second baud rate setting means sets both the acquiring means and the external device to the second baud rate after the acquiring means sends the second supported baud rate signal to the external device.

* * * * *